(12) United States Patent
Mashino

(10) Patent No.: US 8,179,689 B2
(45) Date of Patent: May 15, 2012

(54) PRINTED CIRCUIT BOARD, METHOD OF FABRICATING PRINTED CIRCUIT BOARD, AND SEMICONDUCTOR DEVICE

(75) Inventor: Naohiro Mashino, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 387 days.

(21) Appl. No.: 12/468,899

(22) Filed: May 20, 2009

(65) Prior Publication Data

US 2009/0290317 A1 Nov. 26, 2009

(30) Foreign Application Priority Data

May 23, 2008 (JP) .................................. 2008-135610
May 19, 2009 (JP) .................................. 2009-121425

(51) Int. Cl.
*H05K 1/18* (2006.01)
(52) U.S. Cl. ........ 361/763; 361/760; 361/761; 361/765; 361/766; 361/794
(58) Field of Classification Search ........................ None
See application file for complete search history.

(56) References Cited

U.S. PATENT DOCUMENTS

| 6,407,929 | B1 * | 6/2002 | Hale et al. | 361/763 |
|---|---|---|---|---|
| 6,577,490 | B2 * | 6/2003 | Ogawa et al. | 361/306.1 |
| 6,914,322 | B2 | 7/2005 | Iijima et al. | |
| 7,335,531 | B2 | 2/2008 | Iijima et al. | |
| 7,417,870 | B2 * | 8/2008 | Lim et al. | 361/763 |
| 7,525,814 | B2 * | 4/2009 | Yuri et al. | 361/761 |
| 7,808,799 | B2 * | 10/2010 | Kawabe et al. | 361/765 |
| 2008/0055873 | A1 * | 3/2008 | Mi et al. | 361/761 |
| 2008/0158838 | A1 * | 7/2008 | Inagaki et al. | 361/761 |

FOREIGN PATENT DOCUMENTS

JP 2003-197809 7/2003

* cited by examiner

*Primary Examiner* — Boris Chervinsky
(74) *Attorney, Agent, or Firm* — IPUSA, PLLC

(57) ABSTRACT

A printed circuit board has capacitors, a grounding wiring pattern having a bonding surface on which a semiconductor device is bonded, and a contact surface located opposite from the bonding surface thereof and coupled to first electrodes of the capacitors, and a power supply wiring pattern having a bonding surface on which the semiconductor device is bonded, and a contact surface located opposite from the bonding surface thereof and coupled to second electrodes of the capacitors. The grounding and power supply wiring patterns are alternately arranged in a predetermined direction, and the capacitors are coupled in parallel with respect to the grounding and power supply wiring patterns.

13 Claims, 20 Drawing Sheets

PRINTED CIRCUIT BOARD, METHOD OF FABRICATING PRINTED CIRCUIT BOARD, AND SEMICONDUCTOR DEVICE

BACKGROUND OF THE INVENTION

1. Field of the Invention

The present invention generally relates to printed circuit boards, methods of fabricating the printed circuit boards, and semiconductor devices, and more particularly to a printed circuit board having a capacitor that is electrically coupled to a semiconductor chip, a method of fabricating such a printed circuit board, and a semiconductor device having such a printed circuit board.

2. Description of the Related Art

FIG. 1 is a cross sectional view showing an example of a conventional semiconductor device which reduces an inductance between a semiconductor chip and an internal capacitor of a printed circuit board, by electrically connecting the semiconductor chip and the capacitor by a minimum distance.

A semiconductor device 200 shown in FIG. 1 includes a printed circuit board 201, a semiconductor chip 202, and external connection terminals 203. The printed circuit board 201 has insulator layers 211 and 225, pads 212, a capacitor 213 having a pair of electrodes, vias 218, 219, 226 and 227, wirings 222 and 223, connection pads 231 and 232 for external connection, and a solder resist layer 234.

The capacitor 213 is embedded in the insulator layer 211. Each pad 212 has a bonding surface 212A for flip-chip bonding of the semiconductor chip 202 which will be described later. The pads 212 are embedded in the insulator layer 211 so that the bonding surfaces 212A approximately match a surface 211A of the insulator layer 211.

The capacitor 213 is disposed immediately under the pads 212. One of the pair of electrodes of the capacitor 213 is electrically connected to the pads 212 at portions located on an opposite end from the bonding surfaces 212a, via (that is, by way of) internal connection terminals 215. The capacitor 213 functions as a decoupling capacitor for reducing power supply noise caused by changes in current consumption of the semiconductor chip 202. Pads 216 which electrically connect to the other of the pair of electrodes of the capacitor 213 are provided on the surface of the capacitor 213 located on an opposite end from the surface provided with the internal connection terminals 215.

The vias 218 are embedded in the insulator layer 211, and electrically connect the pads 212 to the wirings 222. The vias 219 are embedded in the insulator layer 211, and electrically connect the pads 216 to the wirings 223.

The wirings 222 are provided on a surface 211B of the insulator layer 211, located on an opposite end from the surface 211A of the insulator layer 211. The wirings 222 are formed integrally with the vias 218. The wirings 222 are electrically connected to the pads 212 via the vias 218.

The wirings 223 are provided on the surface 211B of the insulator layer 211. The wirings 223 are formed integrally with the vias 219. The wirings 223 are electrically connected to the pads 216 via the vias 219.

The insulator layer 225 is provided on the surface 211B of the insulator layer 211 so as to expose portions of the wirings 222 and 223. The vias 226 are embedded in the insulator layer 225, and the vias 226 are electrically connected to the wirings 222. The vias 227 are embedded in the insulator layer 225, and the vias 227 are electrically connected to the wirings 223.

The connection pads 231 are provided on a surface 225A of the insulator layer 255, located on an opposite end of a surface of the insulator layer 225 making contact with the insulator layer 211. The connection pads 231 are formed integrally with the vias 226. The pads 231 are electrically connected to the wirings 222 via the vias 226.

The connection pads 232 are provided on the surface 225A of the insulator layer 225. The connection pads 232 are formed integrally with the vias 227. The connection pads 232 are electrically connected to the wirings 223 via the vias 227.

The solder resist layer 234 is provided on the surface 225A of the insulator layer 225. The solder resist layer 234 includes openings 234A that expose the connection pads 231, and openings 234B that expose the connection pads 232.

The semiconductor chip 202 is flip-chip bonded on the bonding surfaces 212A of the pads 212. Hence, terminals of the semiconductor chip 202 are electrically connected to the capacitor 213 via the pads 212 and the internal connection terminals 215. For example, a semiconductor chip which operates at high frequencies may be used for the semiconductor chip 202.

The external connection terminals 203 are provided on portions of the connection pads 231 that are exposed via the openings 234A, and on portions of the connection pads 232 that are exposed via the openings 234B. For example, a Japanese Laid-Open Patent Publication No. 2003-197809 proposes a structure having exposed connection terminals.

However, the operating frequency of the semiconductor chip 202 has increased in recent years, and an inductance component generated from the capacitor 213 introduces undesirable effects on the semiconductor chip 202, such as an erroneous operation of the semiconductor chip 202.

On the other hand, if the semiconductor chip 202 has various frequency characteristics, the single capacitor 213 within the printed circuit board 201 cannot cope with the various frequency characteristics of the semiconductor chip 202.

SUMMARY OF THE INVENTION

Accordingly, it is a general object of one aspect of the present invention to provide a novel and useful printed circuit board, method of fabricating the printed circuit board, and semiconductor device, in which the problems described above are suppressed.

Another and more specific object of one aspect of the present invention is to provide a printed circuit board, a method of producing the printed circuit board, and a semiconductor device, which can reduce an inductance component generated from a capacitor, and make the capacitor cope with a semiconductor chip having various frequency characteristics, in order to reduce power supply noise caused by a change in a current consumption of the semiconductor chip.

According to one aspect of the present invention, there is provided a printed circuit board comprising a plurality of capacitors each having a first electrode and a second electrode; a grounding wiring pattern having a first chip bonding surface on which a semiconductor device is to be flip-chip bonded, and a first contact surface that is located on an opposite end from the first chip bonding surface and is coupled to first electrode of the capacitors; and a power supply wiring pattern having a second chip bonding surface on which the semiconductor device is to be flip-chip bonded, and a second contact surface that is located on an opposite end from the second chip bonding surface and is coupled to the second electrode of the capacitors, wherein the grounding wiring pattern and the power supply wiring pattern are alternately arranged in a predetermined direction, and the plurality of capacitors are coupled in parallel with respect to the grounding wiring pattern and the power supply wiring pattern.

According to one aspect of the present invention, there is provided a semiconductor device comprising a semiconductor chip; and a printed circuit board, the printed circuit board comprising a plurality of capacitors each having a first electrode and a second electrode; a grounding wiring pattern having a first chip bonding surface on which a semiconductor device is to be flip-chip bonded, and a first contact surface that is located on an opposite end from the first chip bonding surface and is coupled to first electrode of the capacitors; and a power supply wiring pattern having a second chip bonding surface on which the semiconductor device is to be flip-chip bonded, and a second contact surface that is located on an opposite end from the second chip bonding surface and is coupled to the second electrode of the capacitors, wherein the grounding wiring pattern and the power supply wiring pattern are alternately arranged in a predetermined direction, and the plurality of capacitors are coupled in parallel with respect to the grounding wiring pattern and the power supply wiring pattern.

According to one aspect of the present invention, there is provided a method of fabricating a printed circuit board according to one aspect of the present invention described above, comprising forming, on a support body, a resin layer having openings exposing the first chip bonding surface and openings exposing the second chip bonding surface; forming the ground wiring pattern and the power supply wiring pattern on the resin layer, so that the ground wiring pattern and the power supply wiring pattern are alternately arranged in the predetermined direction; coupling the plurality of capacitors to the grounding wiring pattern and the power supply wiring pattern; after coupling the plurality of capacitors, forming, on the resin layer, a reinforcing member made of an insulator and having a penetration part configured to accommodate the plurality of capacitors; and removing the support body.

According to one aspect of the present invention, it is possible to reduce an inductance component generated from the capacitor, and make the capacitor cope with the semiconductor chip having various frequency characteristics, in order to reduce power supply noise caused by a change in a current consumption of the semiconductor chip.

Other objects and further features of the present invention will be apparent from the following detailed description when read in conjunction with the accompanying drawings.

DESCRIPTION OF THE PREFERRED EMBODIMENTS

Figure 2:
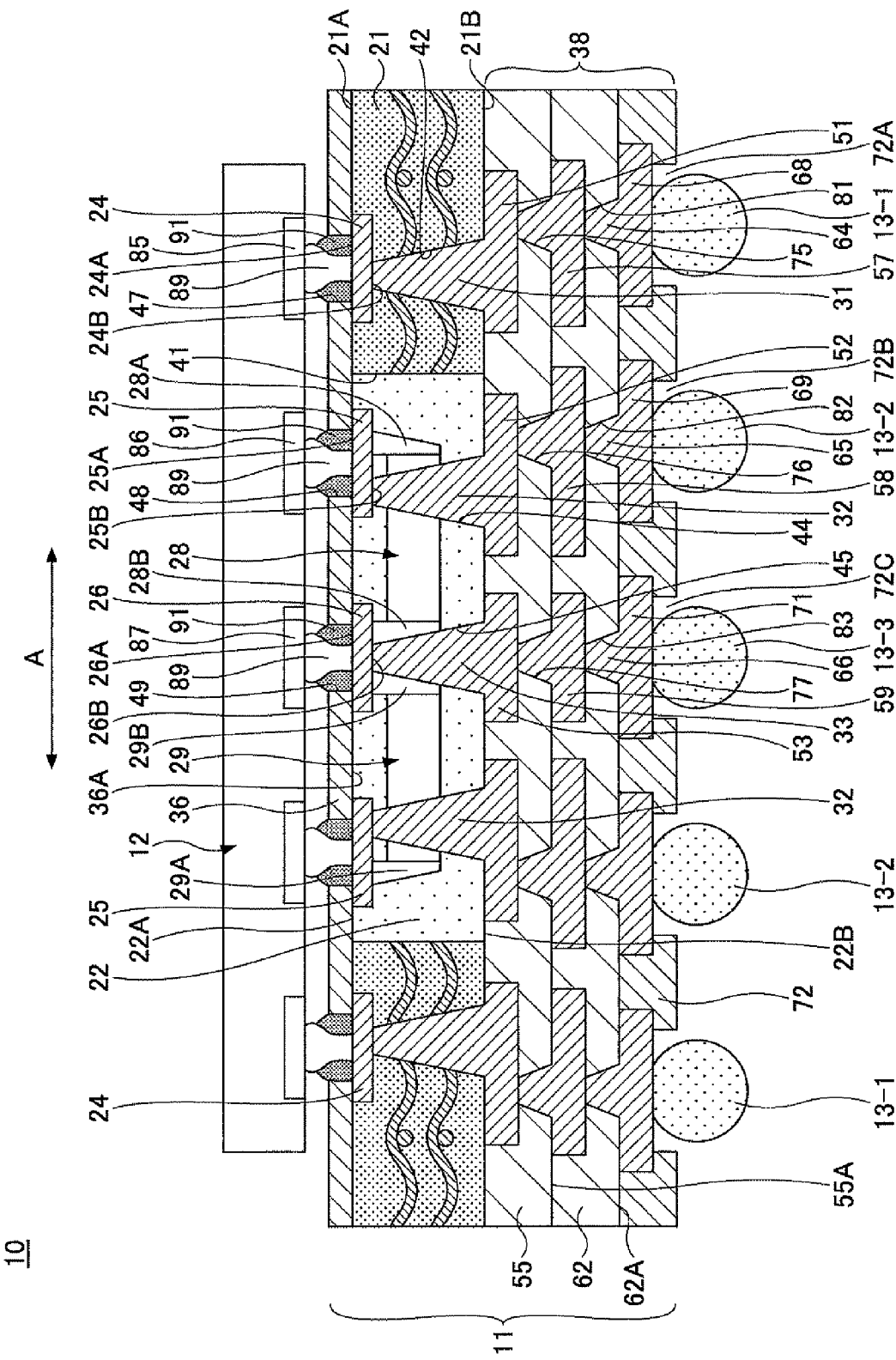
FIG. 2 is a cross sectional view showing a semiconductor device in an embodiment of the present invention.

FIG. 2 is a cross sectional view showing a semiconductor device in an embodiment of the present invention. In FIG. 2, "A" indicates a predetermined direction in which grounding wiring patterns 25 and power supply wiring patterns 26 are alternately arranged. The printed circuit board 11 shown in FIG. 2 corresponds to a cross section of a structure shown in FIG. 3, cut along a line B-B, which will be described later.

In this embodiment, a semiconductor device 10 includes a printed circuit board 11, a semiconductor chip 12, external connection terminals 13-1 for signals, external connection terminals 13-2 for grounding, and external connection terminals 13-3 for power supply.

The printed circuit board 11 has a reinforcing member 21, an insulating member 22, signal pads 24, m+1 grounding wiring patterns 25, m power supply wiring patterns 26, a plurality of capacitors 28 and 29, vias 31, 32 and 33, a solder resist layer 36, and a multi-layer wiring structure (or multi-level interconnection structure) 38, m is a natural number greater than or equal to one. In this embodiment, m=1, and thus, two grounding wiring patterns 25 are provided, and one power supply wiring pattern 26 is provided.

The reinforcing member 21 is made of an insulator, and is provided between the solder resist layer 36 and the multi-layer wiring structure 38. A first planar surface 21A of the reinforcing member 21 makes contact with the solder resist layer 36. A second planar surface 21B of the reinforcing member 21 makes contact with the multi-layer wiring structure 38. The reinforcing member 21 includes penetration parts 41 and penetration holes 42. The penetration part 41 is formed at a central portion of the reinforcing member 21. The penetration part 41 functions as an accommodating part for accommodating the plurality of capacitors 28 and 29. The penetration hole 42 is formed at a portion of the reinforcing member 21 located on the outer side of a region in which the penetration part 41 is formed. The penetration hole 42 exposes a portion of a contact surface 24B of the signal pad 24, located on an opposite end from a chip bonding surface 24A of the signal pad 24 on which the semiconductor chip 12 is bonded. For example, the reinforcing member 21 may be formed by a glass epoxy substrate that is made up of a glass fiber covered by a resin.

By providing the reinforcing member 21, which is formed by the glass epoxy substrate that is made up of a glass fiber covered by a resin, for example, between the solder resist layer 36 and the multi-layer wiring structure 38, the reinforcing member 21 functions as a support member for supporting the multi-layer wiring structure 38, and it is possible to reduce warping of the multi-layer wiring structure 38.

For example, if the height of the plurality of capacitors 28 and 29 is 50 μm, the thickness of the reinforcing member 21 may be 150 μm.

The insulating member 22 is provided in the penetration parts 41 so as to encapsulate the plurality of capacitors 28 and 29 which are connected to the m+1 grounding wiring patterns 25 and the m power supply wiring patterns 26. The insulating member 22 has penetration holes 44 and 45. The penetration hole 44 penetrates a portion of the insulating member 22 opposing a contact surface (or first contact surface) 25B of the grounding wiring pattern 25. The penetration hole 44 exposes a portion of the contact surface 25B. The penetration hole 45 penetrates a portion of the insulating member 22 opposing a contact surface (or second contact surface) 26B of the power supply wiring pattern 26. The penetration hole 45 exposes a portion of the contact surface 26B. A first planar surface 22A of the insulating member 22, located on an opposite end from the end provided with the semiconductor chip 12 by the flip-chip bonding, approximately matches the planar surface 21A of the reinforcing member 21. A second planar surface 22B of the insulator member 22, located on an opposite end from the first planar surface 22A of the insulator member 22, approximately matches the planar surface 21B of the reinforcing member 21. For example, the insulating member 22 may be made of a material selected from materials such as epoxy resins and polyimide resins.

By providing the insulating member 22 which encapsulates the plurality of capacitors 28 and 29, and making the planar surface 22A of the insulating member 22 approximately match the planar surface 21A of the reinforcing member 21, it becomes possible to form the multi-layer wiring structure 38 on the surface 22A of the insulating member 22 and the surface 21A of the reinforcing member 21.

The signal pads 24 have the chip bonding surface 24A on which the semiconductor chip 12 is flip-chip bonded, and the contact surface 24B located on the opposite end from the chip bonding surface 24A. The signal pads 24 are embedded in the reinforcing member 21, so that a chip bonding surface 24A of each signal pad 24 approximately matches the surface 21A of the reinforcing member 21. The signal pads 24 are arranged on the outer side of a region in which the grounding wiring patterns 25 and the power supply wiring patterns 26 are formed. The semiconductor chip 12 is flip-chip bonded on the signal pads 24, and the contact surfaces 24B the signal pads 24 are connected to the vias 31. In addition, the signal pads 24 are electrically connected to the external connection terminals 13-1 for signals, via the multi-layer wiring structure 38. For example, the signal pads 24 may be made of Cu.

The grounding wiring patterns 25 have chip bonding surfaces (or first chip bonding surfaces) 25A, and contact surfaces 25B. The grounding wiring patterns 25 are embedded in the insulating member 22, so that the chip bonding surfaces 25A approximately match the surface 22A of the insulating member 22. The grounding wiring patterns 25 are disposed so that the grounding wiring pattern 25 and the power supply wiring pattern 26 are alternately arranged in the direction A. The semiconductor chip 12 is flip-chip bonded on the chip bonding surfaces 25A, and the contact surfaces are 25B are connected to first electrodes 28A and 29A of the capacitors 28 and 29 and the vias 32. In addition, the grounding wiring patterns 25 are electrically connected to the external connection terminals 13-2 for grounding, via the multi-layer wiring structure 38. For example, the grounding wiring patterns 25 may be made of Cu.

The power supply wiring patterns 26 have chip bonding surfaces (or second chip bonding surfaces) 26A, and contact surfaces 26B. The power supply wiring patterns 26 are embedded in the insulating member 22, so that the chip bonding surfaces 26A approximately match the surface 22A of the insulating member 22. The power supply wiring patterns 26 are disposed so that the grounding wiring pattern 25 and the power supply wiring pattern 26 are alternately arranged in the direction A. The semiconductor chip 12 is flip-chip bonded on the chip bonding surfaces 26A, and the contact surfaces 26B are connected to second electrodes 28B and 29B of the capacitors 28 and 29. In addition, the power supply wiring patterns 26 are electrically connected to the external connection terminals 13-3 for power supply, via the multi-layer wiring structure 38. For example, the power supply wiring patterns 26 may be made of Cu.

Figure 3:
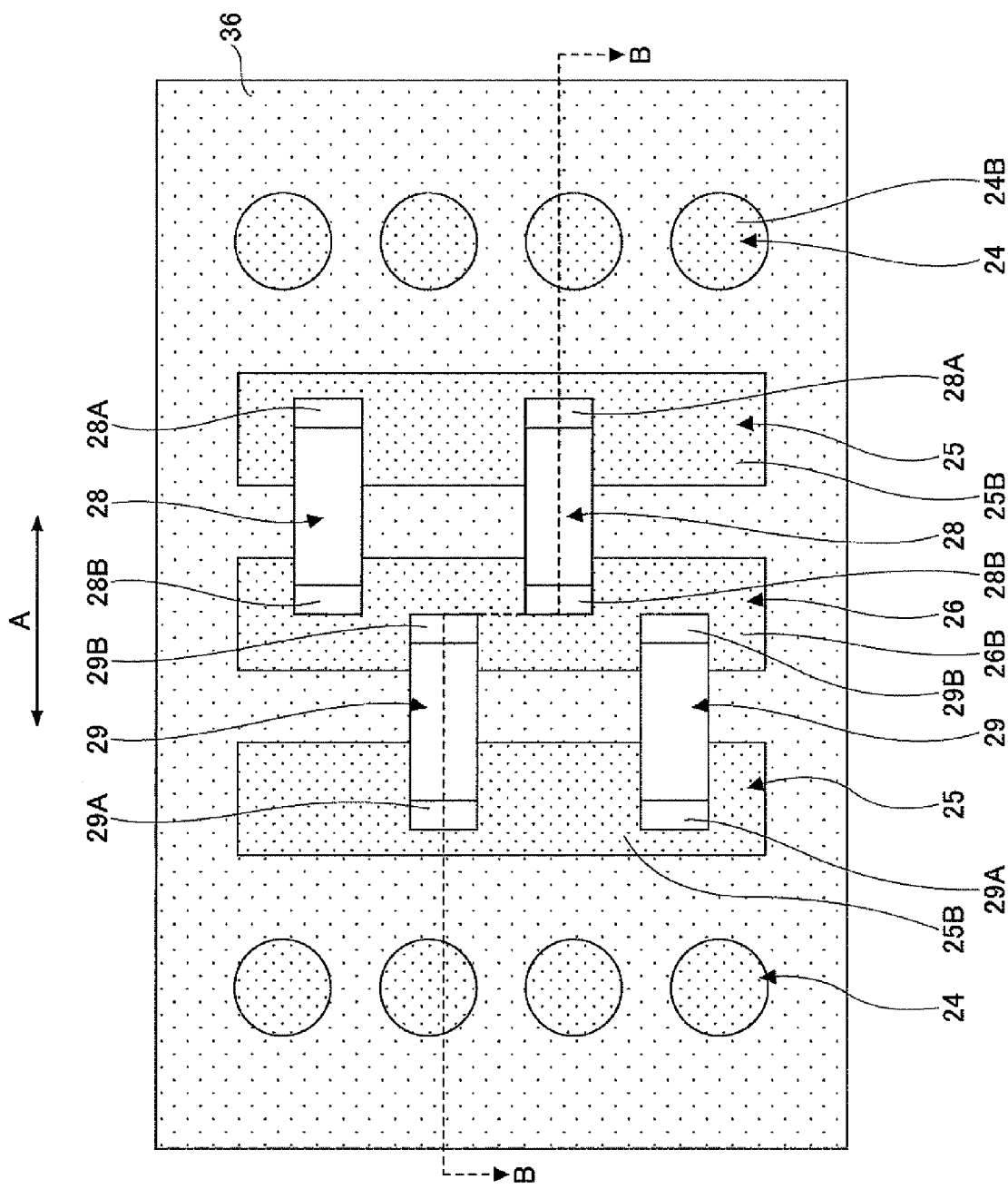
FIG. 3 is a plan view showing grounding wiring patterns and power supply wiring patterns connected to a plurality of capacitors.

FIG. 3 is a plan view showing the grounding wiring patterns and the power supply wiring patterns connected to the plurality of capacitors. For the sake of convenience, FIG. 3 only shows the signal pads 24, the grounding wiring patterns 25, the power supply wiring patterns 26, the solder resist layer 36, and the plurality of capacitors 28 and 29. In FIG. 3, those parts that are the same as those corresponding parts shown in FIG. 2 are designated by the same reference numerals, and a description thereof will be omitted.

A description will now be given of the plurality of capacitors 28 and 29, by referring to FIGS. 2 and 3. The plurality of capacitors 28 (two in this embodiment) are each formed by a two-terminal capacitor having the pair of electrodes 28A and 28B. The electrode 28A connects to the contact surface 25B of one of the two grounding wiring patterns 25 that is not connected to the capacitor 29. The electrode 28B connects to the contact surface 26B of the power supply wiring pattern 26.

The plurality of capacitors 29 (two in this embodiment) are each formed by a two-terminal capacitor having the pair of electrodes 29A and 29B. The electrode 29A connects to the contact surface 25B of the grounding wiring pattern 25 that is not connected to the capacitor 28. The electrode 29B connects to the contact surface 26B of the power supply wiring pattern 26. In other words, the plurality of capacitors 28 and 29 are arranged in parallel with respect to the m+1 grounding wiring patterns 25 and the m power supply wiring patterns 26. The plurality of capacitors 28 and 29 are disposed under the semiconductor chip 12, and are electrically connected to the semiconductor chip 12 via the grounding wiring patterns 25 and the power supply wiring patterns 26. The plurality of capacitors 28 and 29 function as decoupling capacitors for reducing power supply noise caused by changes in current consumption of the semiconductor chip 12.

Accordingly, the m+1 grounding wiring patterns 25 and the m power supply wiring patterns 26 are disposed so that the grounding wiring pattern 25 and the power supply wiring pattern 26 are alternately arranged in the direction A. Further, the plurality of capacitors 28 and 29 are connected in parallel with respect to the m+1 grounding wiring patterns 25 and the power supply wiring patterns 26. For this reason, it is possible to reduce the inductance components of the plurality of capacitors 28 and 29, when compared to the inductance component of the single capacitor 213 provided in the printed circuit board 201 of the conventional semiconductor device 200 shown in FIG. 1.

The capacitances of the plurality of capacitors 28 and 29 may be set to mutually different values in a case where the semiconductor chip 12 has various high-frequency characteristics. By setting the capacitances of the plurality of capacitors 28 and 29 to mutually different values in order to cope with the semiconductor chip 12 having various high-frequency characteristics, it becomes possible to reduce the power supply noise caused by the changes in the current consumption of the semiconductor chip 12 by the plurality of capacitors 28 and 29.

As shown in FIG. 2, the vias 31 are provided in the penetration holes 42, and connect to the contact surfaces 24B of the signal pads 24. Hence, the vias 31 are electrically connected to the semiconductor chip 12 via the signal pads 24. In addition, the vias 31 are electrically connected to the external connection terminals 13-1 for signals, via the multi-layer wiring structure 38.

The vias 32 are provided in the penetration holes 44, and connect to the contact surfaces 25B of the grounding wiring patterns 25. Thus, the vias 32 are electrically connected to the semiconductor chip 12 via the grounding wiring patterns 25. Further, the vias 32 are electrically connected to the external connection terminals 13-2 for grounding, via the multi-layer wiring structure 38.

The vias 33 are provided in the penetration holes 45, and connect to the contact surfaces 26B of the power supply wiring patterns 26. Hence, the vias 33 are electrically connected to the semiconductor chip 12 via the power supply wiring patterns 26. Moreover, the vias 33 are electrically connected to the external connection terminals 13-1 for power supply, via the multi-layer wiring structure 38. For example, the vias 31, 32 and 33 may be made of Cu.

The solder resist layer 36 is provided on the surface 21A of the reinforcing member 21 and the surface 22A of the insulating member 22. The solder resist layer 36 includes openings 47, 48 and 49. The opening 47 exposes the chip bonding surface 24A of the signal pad 24. The opening 48 exposes the chip bonding surface 25A of the grounding wiring pattern 25. The opening 49 exposes the chip bonding surface 26A of the power supply wiring pattern 26.

The multi-layer wiring structure 38 is provided on a surface 21B of the reinforcing member 21 and the surface 22B of the insulating member 22. The multi-layer wiring structure 38 includes wirings 51, 52 and 53, insulator layers 55 and 62, wiring patterns 57, 58 and 59, vias 64, 65 and 66, connection pads 68, 69 and 71 for external connection, and a solder resist layer 72.

The wiring 51 is provided on the surface 21B of the reinforcing member 21, and is formed integrally to the via 31. The wiring 51 is electrically connected to the signal pad 24 via the via 31.

The wiring 52 is provided on the surface 22B of the insulating member 22, and is formed integrally to the via 32. The wiring 52 is electrically connected to the grounding wiring pattern 25 via the via 32.

The wiring 53 is provided on the surface 22B of the insulating member 22, and is formed integrally to the via 33. The wiring 53 is electrically connected to the power supply wiring pattern 26 via the via 33. For example, the wirings 51, 52 and 53 may be made of Cu.

The insulator layer 55 is provided on the surface 21B of the reinforcing member 21 and on the surface 22B of the insulating member 22, so as to cover portions of the wirings 51, 52 and 53. The insulator layer 55 includes openings 75, 76 and 77. The opening 75 exposes a portion of the wiring 51. The opening 76 exposes a portion of the wiring 52. The opening 77 exposes a portion of the wiring 53. For example, the insulator layer 55 may be formed by a resin layer. When the insulator layer 55 is formed by the resin layer, this resin layer may be made of a material such as epoxy resins and polyimide resins.

The wiring pattern 57 is provided in the opening 75 and on a surface 55A of the insulator layer 55 that is located on the end where the insulator layer 62 is provided. The wiring pattern 57 is connected to the wiring 51. The wiring pattern 58 is provided in the opening 76 and on the surface 55A of the insulator layer 55. The wiring pattern 58 is connected to the wiring 52. The wiring pattern 59 is provided in the opening 77 and on the surface 55A of the insulator layer 55. The wiring pattern 59 is connected to the wiring 53. For example, the wiring patterns 57, 58 and 59 may be made of Cu.

The insulator layer 62 is provided on the surface 55A of the insulator layer 55, so as to cover portions of the wiring patterns 57, 58 and 59. The insulator layer 62 includes openings 81, 82 and 83. The opening 81 exposes a portion of the wiring pattern 57. The opening 82 exposes a portion of the wiring pattern 58. The opening 83 exposes a portion of the wiring pattern 59. For example, the insulator layer 59 may be formed by a resin layer. When the insulator layer 59 is formed by the resin layer, this resin layer may be made of a material such as epoxy resins and polyimide resins.

The via 64 is provided in the opening 81. The via 64 is connected to the wiring pattern 57. The via 65 is provided in the opening 82. The via 65 is connected to the wiring pattern 58. The via 66 is provided in the opening 83. The via 66 is connected to the wiring pattern 59. For example, the vias 64, 65 and 66 may be made of Cu.

The connection pad 68 is provided on a surface 62A of the insulator layer 62, and is formed integrally to the via 64. The connection terminal 68 is electrically connected to the wiring pattern 57 via the via 64. The connection pad 69 is provided on the surface 62A of the insulator layer 62, and is formed integrally to the via 65. The connection pad 69 is electrically connected to the wiring pattern 58 via the via 65. The connection pad 71 is provided on the surface 62A of the insulator layer 62, and is formed integrally to the via 66. The connection pad 71 is electrically connected to the wiring pattern 59 via the via 66. For example, the connection pads 68, 69 and 71 may be formed by a stacked structure which is formed on the surface 62A of the insulator layer 62 by successively stacking a Cu layer, a Ni layer and a Au layer.

The solder resist layer 72 is provided on the surface 62A of the insulator layer 62. The solder resist layer 72 includes openings 72A, 72B and 72C. The opening 72A exposes a portion of the connection pad 68. The opening 72B exposes a portion of the connection pad 69. The opening 72C exposes a portion of the connection pad 71.

According to the printed circuit board 11 of this embodiment, the m+1 grounding wiring patterns 25 and the m power supply wiring patterns 26 are disposed so that the grounding wiring pattern 25 and the power supply wiring pattern 26 are alternately arranged in the direction A. In addition, the plurality of capacitors 28 and 29 are connected in parallel with respect to the mil grounding wiring patterns 25 and the power supply wiring patterns 26. For this reason, it is possible to reduce the inductance components of the plurality of capacitors 28 and 29, when compared to the inductance component of the single capacitor 213 provided in the printed circuit board 201 of the conventional semiconductor device 200 shown in FIG. 1.

In addition, the capacitances of the plurality of capacitors 28 and 29 may be set to mutually different values in a case where the semiconductor chip 12 has various high-frequency characteristics. By setting the capacitances of the plurality of capacitors 28 and 29 to mutually different values in order to cope with the semiconductor chip 12 having various high-frequency characteristics, it becomes possible to reduce the power supply noise caused by the changes in the current consumption of the semiconductor chip 12 by the plurality of capacitors 28 and 29.

As shown in FIG. 2, the semiconductor chip 12 includes an electrode pad 85 for signal, an electrode pad 86 for grounding, and an electrode pad 87 for power supply. A bump 89 is provided on each of the electrode pads 85, 86 and 87. The bump 89 provided on the electrode pad 85 is fixed to the chip bonding surface 24A of the signal pad 24 by solder 91. Hence, the electrode pad 85 is electrically connected to signal pad 24.

The bump 89 provided on the electrode pad 86 is fixed to the chip bonding surface 25A of the grounding wiring pattern 25 by solder 91. Hence, the electrode pad 86 is electrically connected to the grounding wiring pattern 25.

The bump 89 provided on the electrode pad 87 is fixed to the chip bonding surface 26A of the power supply wiring pattern 26. Hence, the electrode pad 87 is electrically connected to the power supply wiring pattern 26.

In other words, the semiconductor chip 12 is flip-chip bonded with respect to the chip bonding surfaces 24A of the signal pads 24, the chip bonding surfaces 25A of the m+1 grounding wiring patterns 25, and the chip bonding surfaces 26A of the m power supply wiring patterns 26. Thus, the semiconductor chip 12 is electrically connected to the printed circuit board 11. For example, a semiconductor chip having a CPU, a semiconductor chip for high-frequency operation, and the like may be used for the semiconductor chip 12.

The connection terminal 13-1 is provided on a portion of the connection pad 68 exposed in the opening 72A. For example, the connection terminal 13-1 may be formed by a solder ball. The connection terminal 13-2 is provided on a portion of the connection pad 69 exposed in the opening 72B. For example, the connection terminal 13-2 may be formed by a solder ball. The connection terminal 13-3 is provided on a portion of the connection pad 71 exposed in the opening 72C. For example, the connection terminal 13-3 may be formed by a solder ball. The connection terminals 13-1, 13-2 and 13-3 form external connection terminals that are used for mounting the semiconductor device 10 on a mounting substrate or board (not shown), such as a mother board.

According to the semiconductor device 10 of this embodiment, it is possible to obtain effects similar to those obtainable by the printed circuit board 11 described above, because the semiconductor 10 has the printed circuit board 11 described above.

In the semiconductor device 10 of this embodiment, the m+1 grounding wiring patterns 25 and the m power supply wiring patterns 26 are disposed so that the grounding wiring pattern 25 and the power supply wiring pattern 26 are alternately arranged in the direction A. In addition, the plurality of capacitors 28 and 29 are connected in parallel with respect to the m+1 grounding wiring patterns 25 and the power supply wiring patterns 26. For this reason, it is possible to reduce the inductance components of the plurality of capacitors 28 and 29, when compared to the inductance component of the single capacitor 213 provided in the printed circuit board 201 of the conventional semiconductor device 200 shown in FIG. 1.

In addition, the capacitances of the plurality of capacitors 28 and 29 may be set to mutually different values in a case where the semiconductor chip 12 has various high-frequency characteristics. By setting the capacitances of the plurality of capacitors 28 and 29 to mutually different values in order to cope with the semiconductor chip 12 having various high-frequency characteristics, it becomes possible to reduce the power supply noise caused by the changes in the current consumption of the semiconductor chip 12 by the plurality of capacitors 28 and 29.

In the embodiment described above, m+1 grounding wiring patterns 25 and m power supply wiring patterns 26 are provided. However, it is of course possible provide m grounding wiring patterns 25 and m+1 power supply wiring patterns 26 instead. In this latter case, it is possible to obtain the same effects as those obtainable by the printed circuit board 11 and the semiconductor device 10 described above.

Furthermore, the number of each of the capacitors 28 and 29 provided with respect to the m+1 grounding wiring patterns 25 and the m power supply wiring patterns 26 is not limited to that of the embodiment described above.

FIGS. 4 through 20 are diagrams showing fabricating processes of the semiconductor device in this embodiment of the present invention. The cross sections shown in FIGS. 4 through 20 correspond to the cross section of the structure shown in FIG. 3, cut along the line B-B. Although the electrode 28B of the capacitor 28 and the electrode 29B of the capacitor 29 will contact each other in the cross section when the structure shown in FIG. 3 is cut along the line B-B, the electrodes 28B and 29B are actually separated from each other as may be seen from FIG. 3. For this reason, FIGS. 8 through 20 show the structure in a state where the electrode 28B of the capacitor 28 and the electrode 29B of the capacitor 29 are separated from each other.

In FIGS. 4 through 20, those parts that are the same as those corresponding parts in FIGS. 2 and 3 are designated by the same reference numerals, and a description thereof will be omitted. In FIG. 16, "C" denotes a cutting position where a main support body 103 and two metal films 105 are cut.

A description will be given of the method of fabricating the semiconductor device 10 of this embodiment, by referring to FIG. 4.

Figure 4:
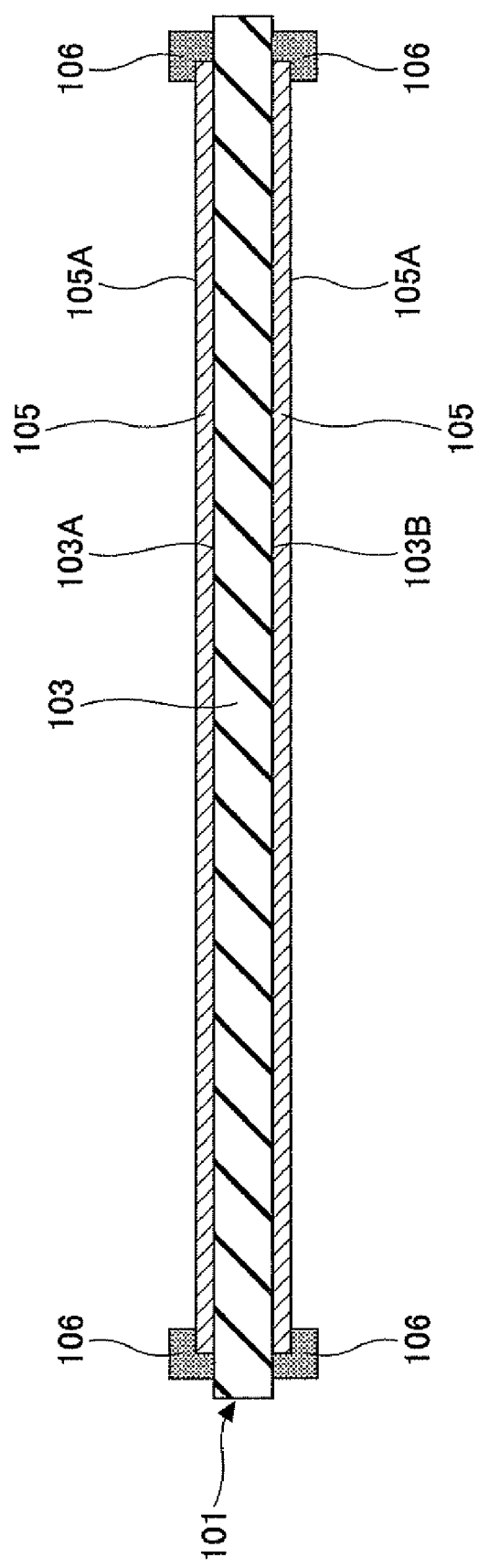
FIG. 4 is a diagram showing a fabricating process of the semiconductor device in the embodiment of the present invention.

First, in the preparation process shown in FIG. 4, a support body 101 for use in fabricating the printed circuit board 11 is prepared. The support body 101 includes a plate-shaped main support body 103, metal films 105 provided on both surfaces 103A and 103B of the main support body 103, and a bonding agent 106 which bonds an outer peripheral part of the metal film 105 to the main support body 103.

For example, the main support body 103 may be made of a metal plate or a resin substrate that is provided with a metal film. The metal plate forming the main support body 103 may be made of a metal such as CU, Ni and Al, glass epoxy, and the like. In this case, the main support body 103 may have a thickness of 0.8 mm, for example.

For example, the metal film 105 may be made of Cu. A Cu film forming the metal film 105 may have a thickness of 12 µm, for example.

Figure 5:
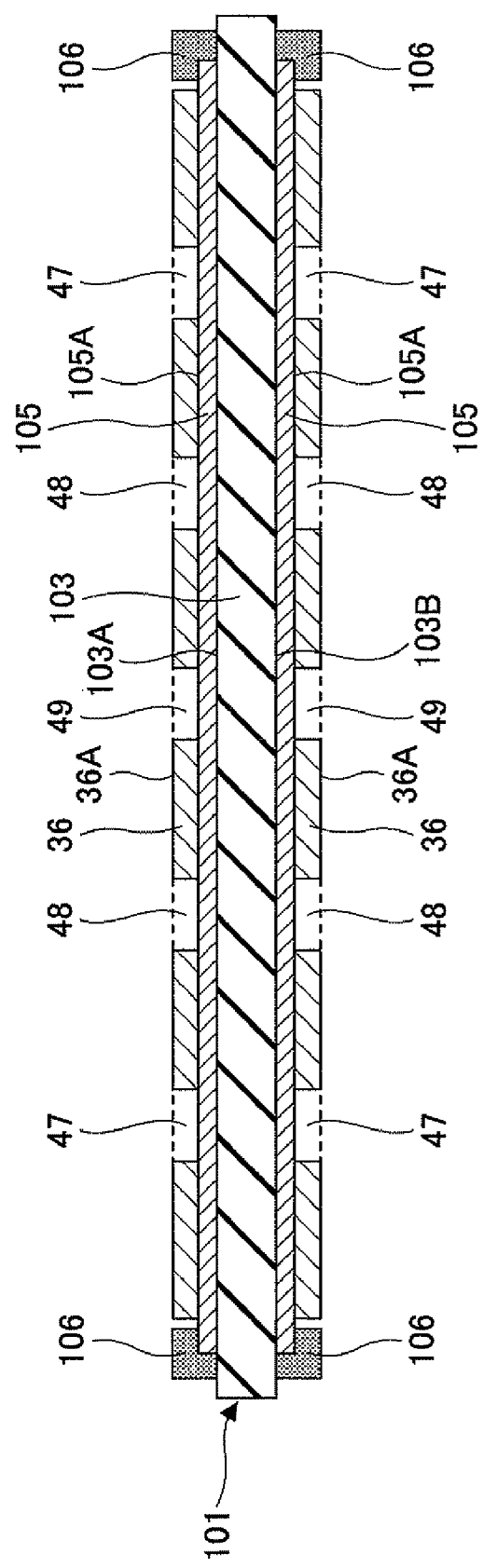
FIG. 5 is a diagram showing a fabricating process of the semiconductor device in the embodiment of the present invention.

In the resin layer forming process shown in FIG. 5, the solder resist layer 36 made of a resin and having the openings 47, 48 and 49 is formed on a surface 105A of the metal film 105 which is provided on the surfaces 103A and 103B of the main support body 103. More particularly, the solder resist layer 36 is formed by adhering a dry film resist on the surface 105A of the metal film 105, and thereafter exposing and developing the dry film resist at portions corresponding to the regions where the openings 47, 48 and 49 are formed.

The opening 47 exposes the portion of the signal pad 24 on which the semiconductor chip 12 is flip-chip bonded. Hence, the opening 47 is formed so as to expose a portion of the surface 105A of the metal film 105 corresponding to the region where the signal pad 24 is formed. The opening 48 exposes the portion of the grounding wiring pattern 25 on which the semiconductor chip 12 is flip-chip bonded. Hence, the opening 48 is formed so as to expose a portion of the surface 105A of the metal film 105 corresponding to the region where the grounding wiring pattern 25 is formed. The opening 49 exposes the portion of the power supply wiring pattern 36 on which the semiconductor chip 12 is flip-chip bonded. Hence, the opening 49 is formed so as to expose a portion of the surface 105A of the metal film 105 corresponding to the region where the power supply wiring pattern 26 is formed.

Figure 6:
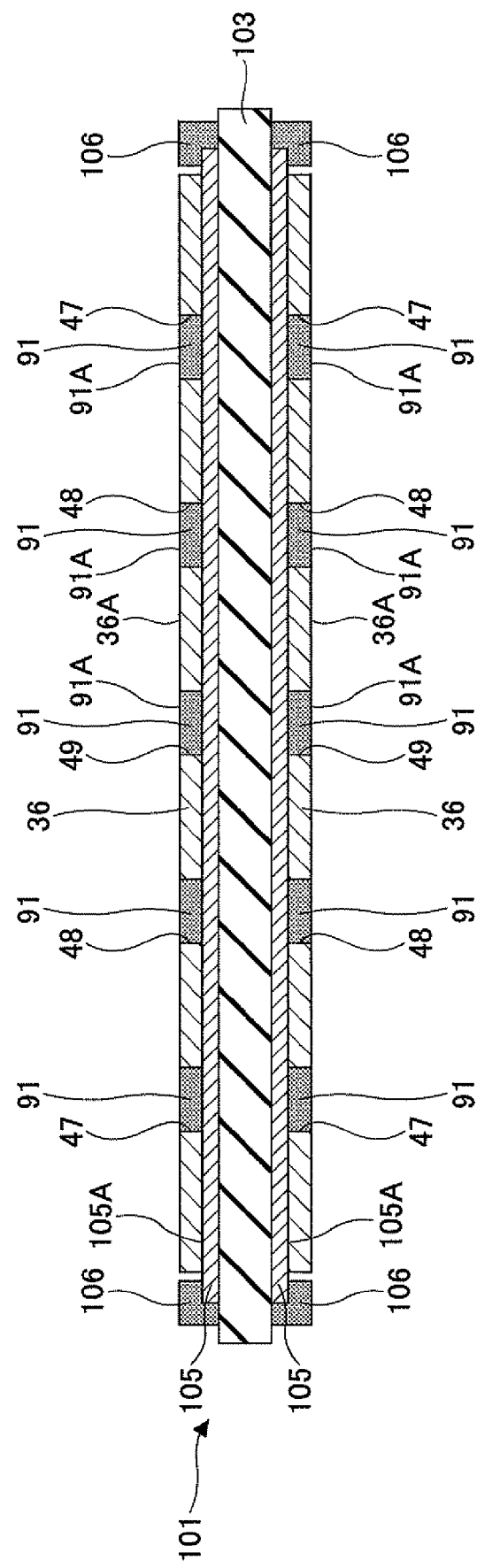
FIG. 6 is a diagram showing a fabricating process of the semiconductor device in the embodiment of the present invention.

Next, in the process shown in FIG. 6, the solder 91 is formed so as to fill the openings 47, 48 and 49 provided in the structure shown in FIG. 5. More particularly, the solder 91 is formed in the openings 47, 48 and 49 by electroplating using the metal films 105 as power feed layers.

Figure 7:
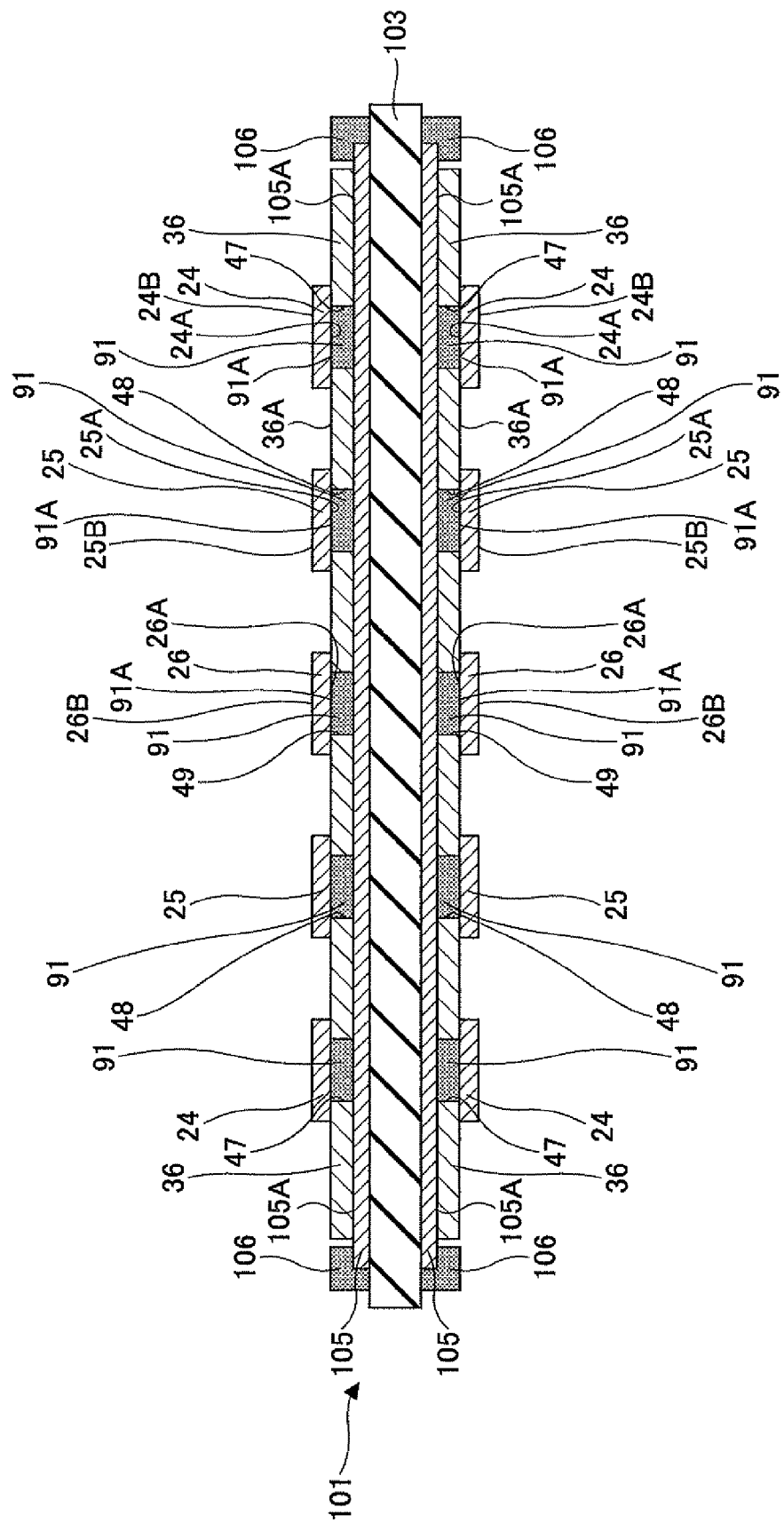
FIG. 7 is a diagram showing a fabricating process of the semiconductor device in the embodiment of the present invention.

In the wiring pattern forming process shown in FIG. 7, the signal pads 24 covering a surface 91A of the solder 91 filling the opening 47, the m+1 grounding wiring patterns 25 covering the surface 91A of the solder 91 filling the openings 48, and the m power supply wiring patterns 26 covering the surface 91A of the solder 91 filling the openings 49, are simultaneously formed on a surface 36A of the solder resist layer 36 which is provided in the structure shown in FIG. 6. More particularly, the signal pads 24, the m+1 grounding wiring patterns 25 and the m power supply wiring patterns 26 are formed using the semi-additive technique, for example.

In this state, the m+1 grounding wiring patterns 25 and the m power supply wiring patterns 26 are formed so that the grounding wiring pattern 25 and the power supply wiring pattern 26 are alternately arranged in the direction A. For example, the signal pads 24, the m+1 grounding wiring patterns 25 and the m power supply wiring patterns 26 may be made of Cu.

Figure 8:
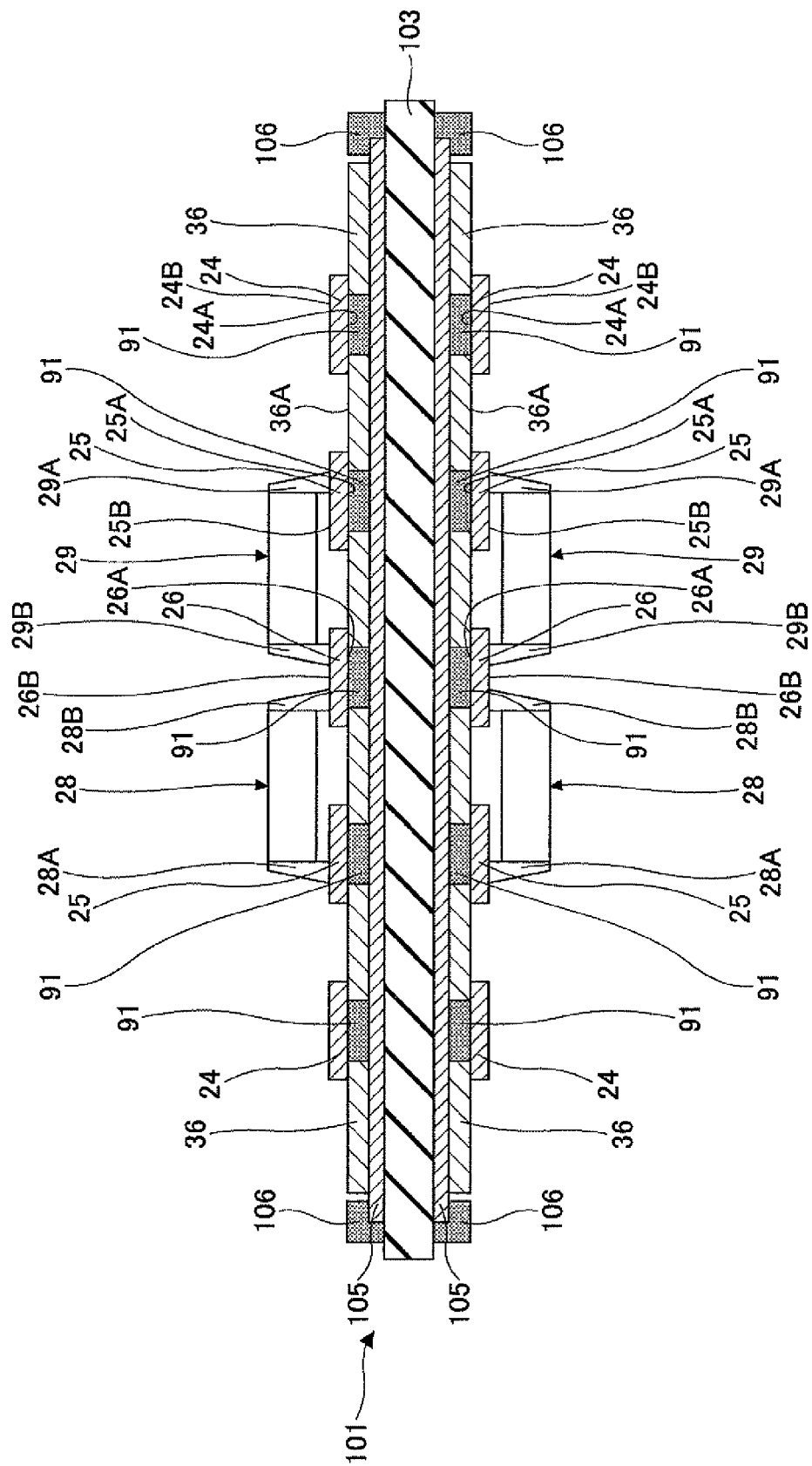
FIG. 8 is a diagram showing a fabricating process of the semiconductor device in the embodiment of the present invention.

Next, in the capacitor connecting process shown in FIG. 8, the plurality of capacitors 28 and 29 are connected in parallel with respect to the m+1 grounding wiring patterns 25 and the power supply wiring patterns 26 that are provided on the top and bottom surfaces of the structure shown in FIG. 7. The plurality of capacitors 28 are each formed by a two-terminal capacitor having the pair of electrodes 28A and 28B. The electrode 28A connects to the contact surface 25B of one of the two grounding wiring patterns 25 that is not connected to the capacitor 29, and the electrode 28B connects to the contact surface 26B of the power supply wiring pattern 26.

The plurality of capacitors 29 are each formed by a two-terminal capacitor having the pair of electrodes 29A and 29B. The electrode 29A connects to the contact surface 26B of the grounding wiring pattern 25 that is not connected to the capacitor 28. The electrode 29B connects to the contact surface 26B of the power supply wiring pattern 26.

Figure 1:
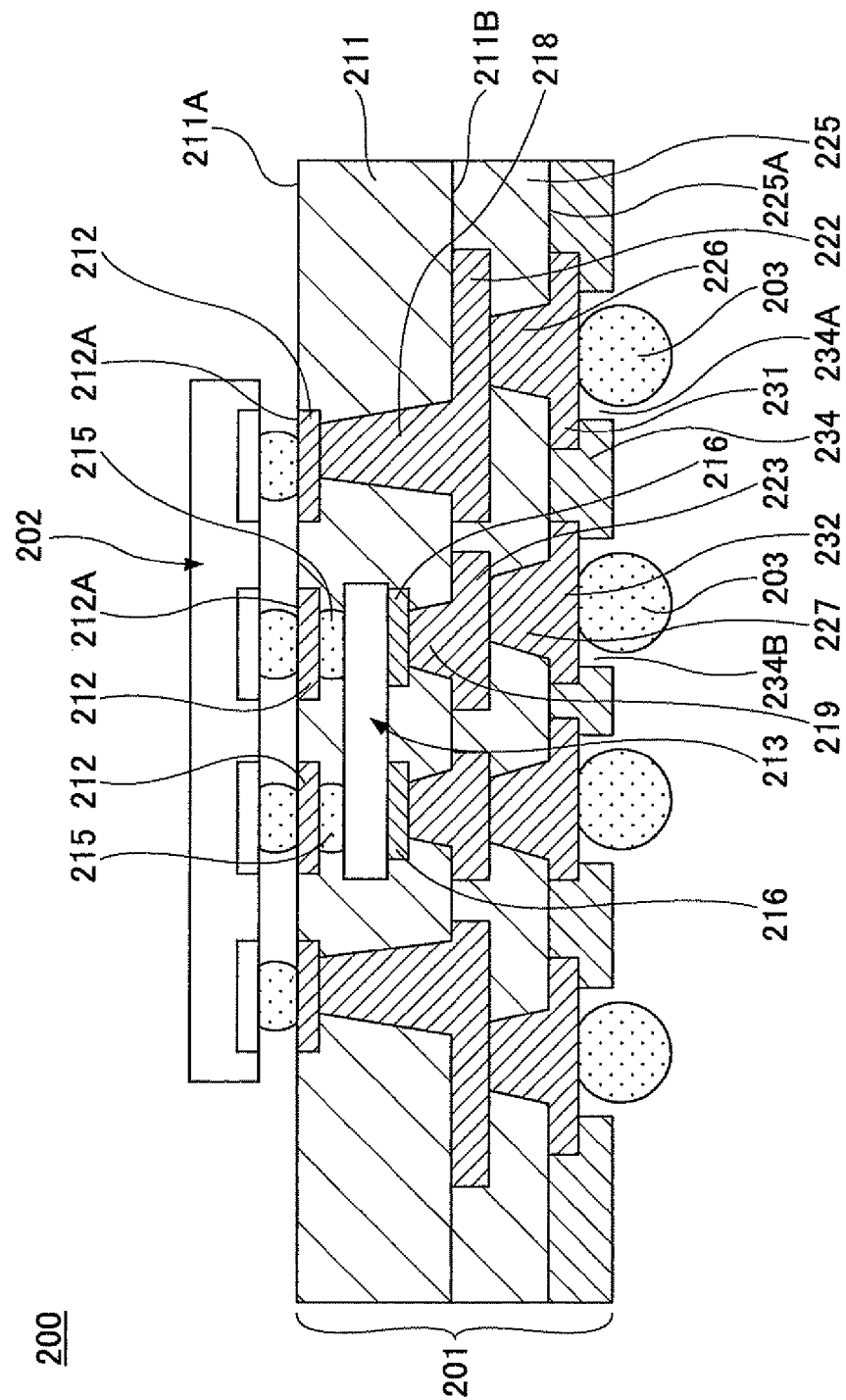
FIG. 1 is a cross sectional view showing an example of a conventional semiconductor device.

Accordingly, by forming the solder resist layer 36 including the openings 47, 48 and 49 on the support body 101, then filling the openings 47, 48 and 49 by the solder 91, then forming the m+1 grounding wiring patterns 25 and the m power supply wiring patterns 26 on the surface 36A of the solder resist layer 36 and the surface 91A of the solder 91 so that the grounding wiring pattern 25 and the power supply wiring pattern 26 are alternately arranged in the direction A, and then connecting the plurality of capacitors 28 and 29 in parallel with respect to the m+1 grounding wiring patterns 25 and the power supply wiring patterns 26, it becomes possible to reduce the inductance components of the plurality of capacitors 28 and 29, when compared to the inductance component of the single capacitor 213 provided in the printed circuit board 201 of the conventional semiconductor device 200 shown in FIG. 1.

In addition, by setting the capacitances of the plurality of capacitors 28 and 29 to mutually different values in order to cope with the semiconductor chip 12 having various high-frequency characteristics when connecting the plurality of capacitors 28 and 29 in parallel with respect to the m+1 grounding wiring patterns 25 and the power supply wiring patterns 26 in the capacitor connecting process, it becomes possible to reduce the power supply noise caused by the changes in the current consumption of the semiconductor chip 12 by the plurality of capacitors 28 and 29.

Figure 9:
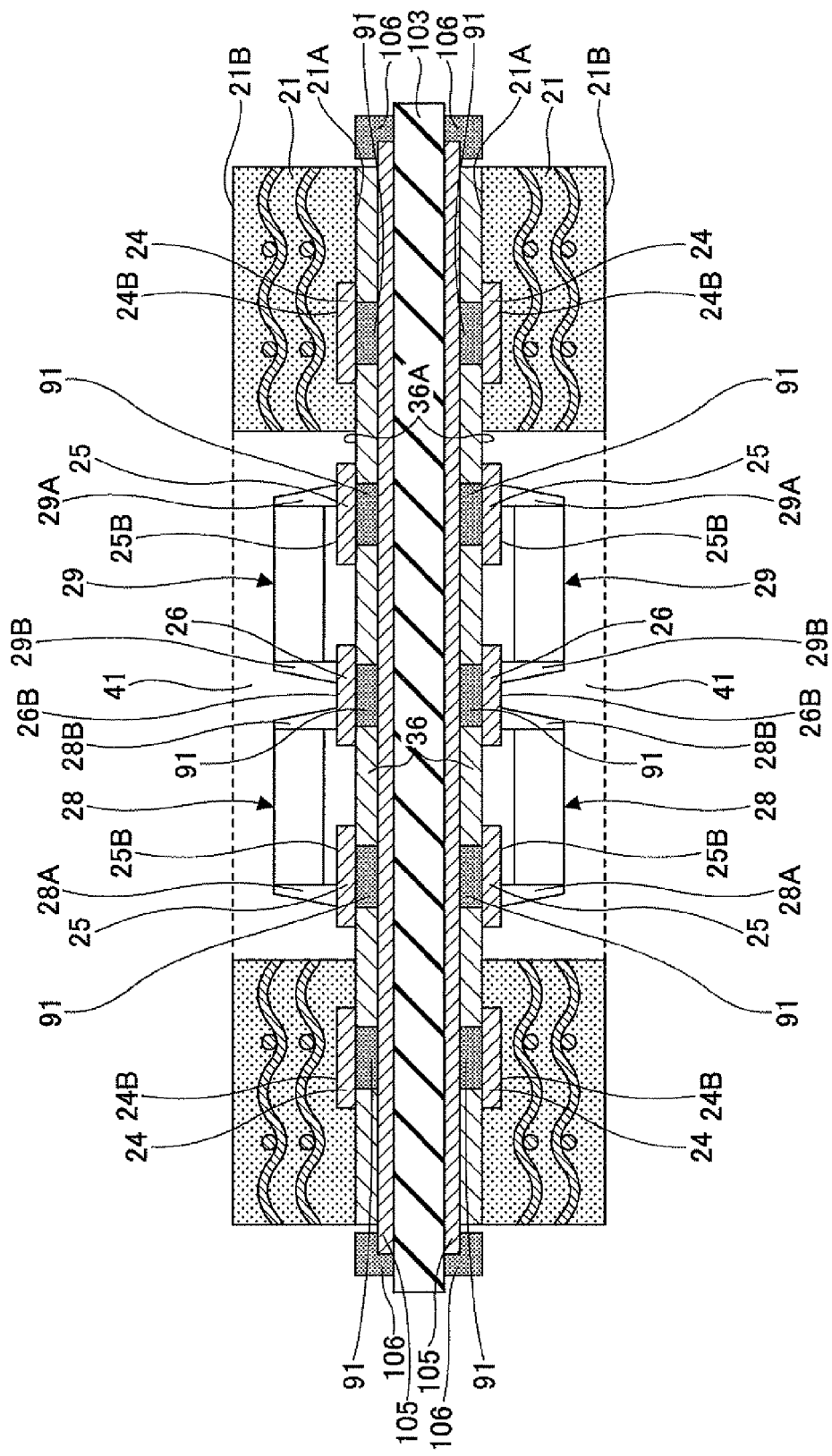
FIG. 9 is a diagram showing a fabricating process of the semiconductor device in the embodiment of the present invention.

Next, in the reinforcing member forming process shown in FIG. 9, the reinforcing member 21, which is an insulator and has the penetration part 41 for accommodating the plurality of capacitors 28 and 29, is formed on the surface 36A of the solder resist layer 36 that is provided on the structure shown in FIG. 8. For example, the reinforcing member 21 may be formed by a glass epoxy substrate that is made up of a glass fiber covered by a resin. If the height of the plurality of capacitors 28 and 29 is 50 µm, the thickness of the reinforcing member 21 may be 150 µm.

By providing the reinforcing member 21, which is formed by the glass epoxy substrate that is made up of a glass fiber covered by a resin, for example, it is possible to reduce warping of the multi-layer wiring structure 38.

Figure 10:
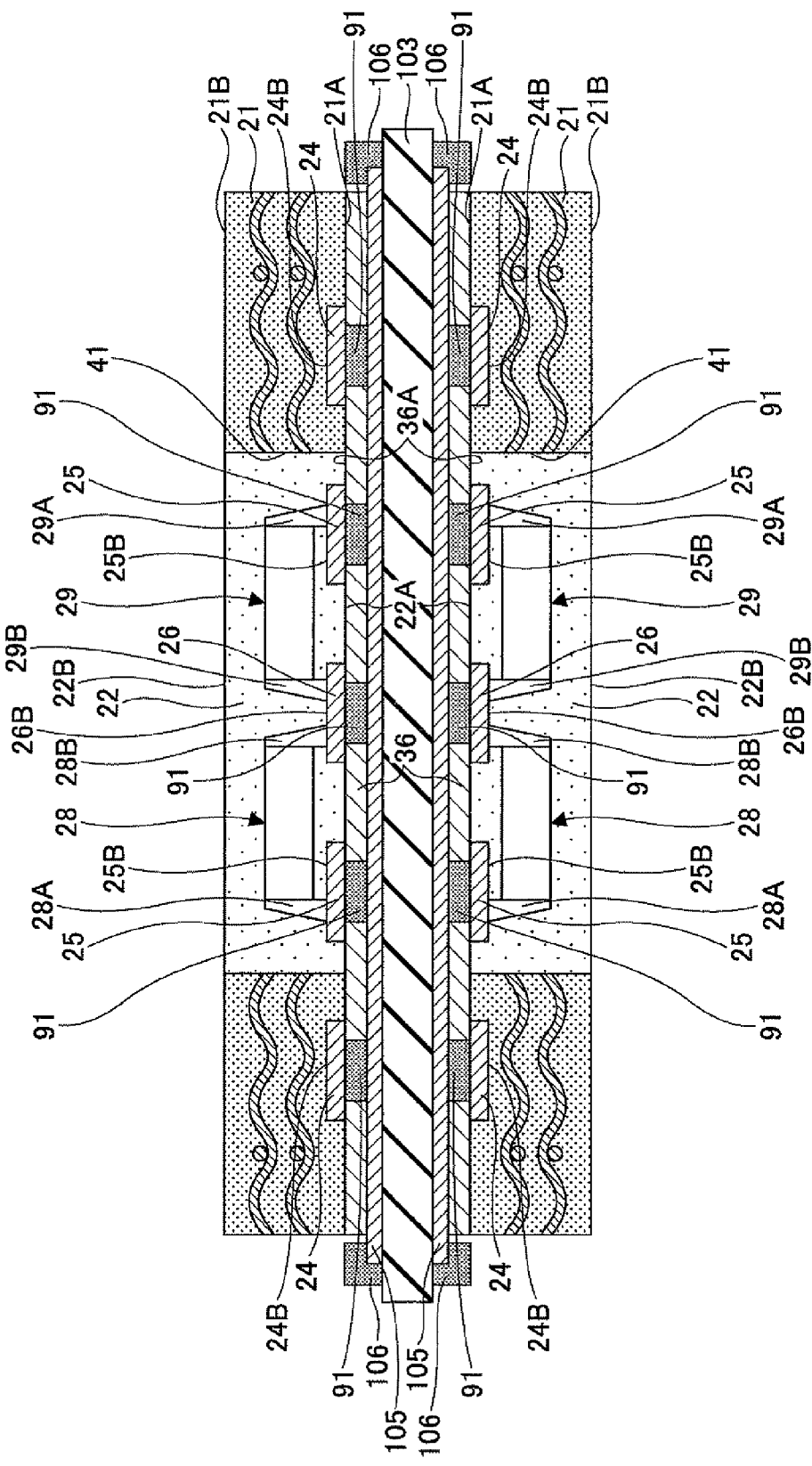
FIG. 10 is a diagram showing a fabricating process of the semiconductor device in the embodiment of the present invention.

Next, in the insulating member forming process shown in FIG. 10, the plurality of capacitors 28 and 29 accommodated within the penetration part 41 are encapsulated by the insulating member 22. In this state, the insulating member 22 is formed so that the surface 22B of the insulating member 22 and the surface 21B of the reinforcing member 21 approximately match. For example, the insulating member 22 may be made of epoxy resins and polyimide resins.

By forming the insulating member 22 to encapsulate the plurality of capacitors 28 and 29 accommodated within the penetration part 41, and making the surface 22B of the insulating member 22 approximately match the surface 21B of the reinforcing member 21, it becomes possible to form the multi-layer wiring structure 38 on the surface 21B of the reinforcing member 21 and the surface 22B of the insulating member 22.

Figure 11:
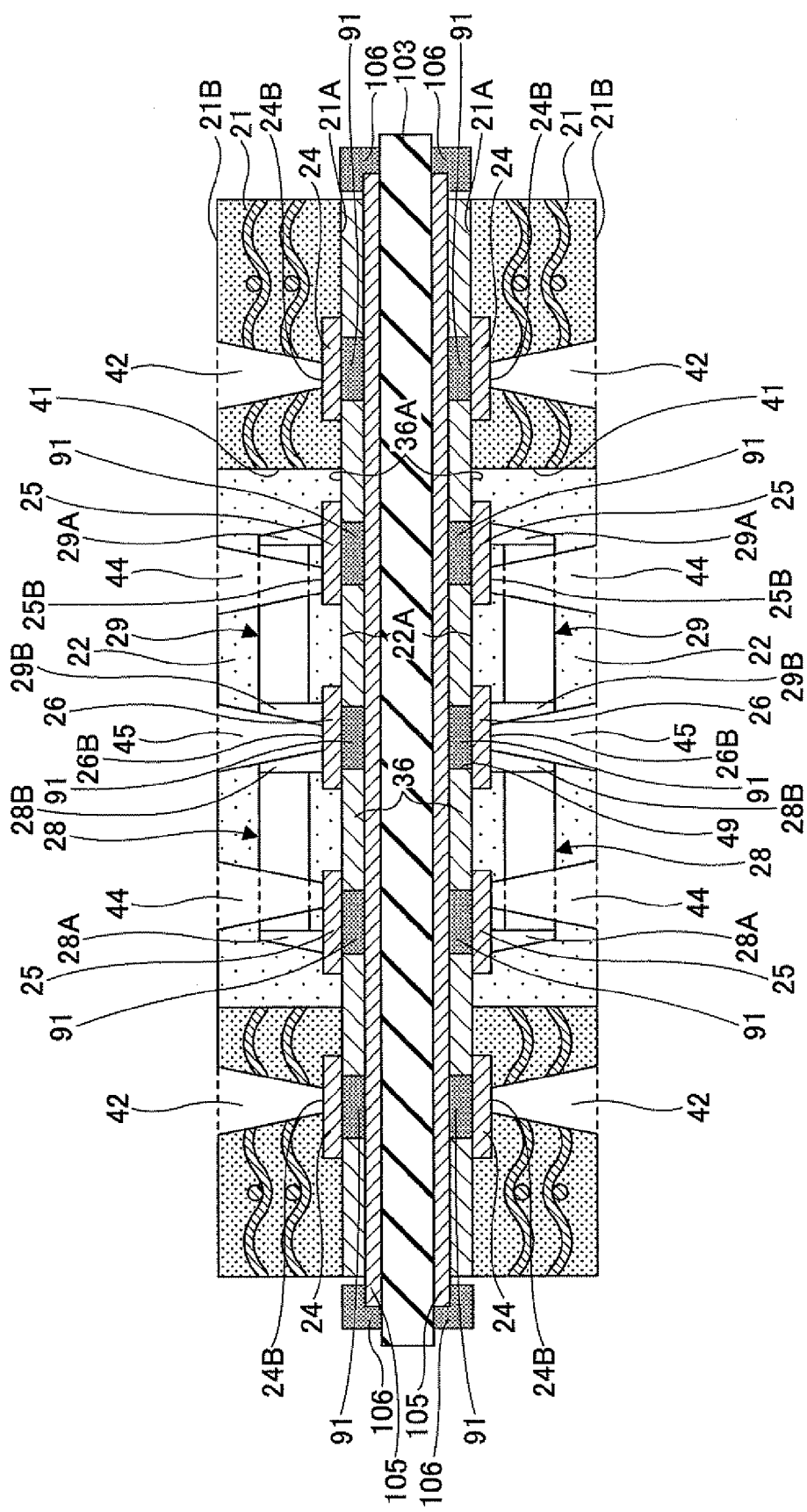
FIG. 11 is a diagram showing a fabricating process of the semiconductor device in the embodiment of the present invention.

Next, in the process shown in FIG. 11, the penetration hole 42 is formed in the reinforcing member 21 that is provided on the structure shown in FIG. 10 in order to expose the contact surface 24B. In addition, the penetration holes 44 and 45 are formed in the insulating member 22 that is provided on the structure shown in FIG. 10 in order to expose the contact surface 25B and the contact surface 26B, respectively. For example, the penetration holes 42, 44 and 45 may be formed by laser processing.

In FIG. 11, the penetration holes 44 and 45 are illustrated as if the penetration holes 44 and 34 are formed along the line B-B in FIG. 3, but this illustration is made in order to facilitate the understanding of the positional relationship between the grounding wiring pattern 25 and the penetration hole 44 and the positional relationship between the power supply wiring pattern 26 and the penetration hole 45, in the cross section. In the plan view of FIG. 3, the penetration holes 44 and 45 would not be formed at least on the capacitors 28 and 29 themselves. Rather, the penetration hole 44 in the plan view would be formed on the contact surface 25B at a portion where the capacitors 28 and 29 are not formed. Similarly, the penetration hole 45 in the plan view would be formed on the contact surface 26B at a portion where the capacitors 28 and 29 are not formed. The above similarly applies to each of FIG. 2 and FIGS. 11 through 20.

Figure 12:
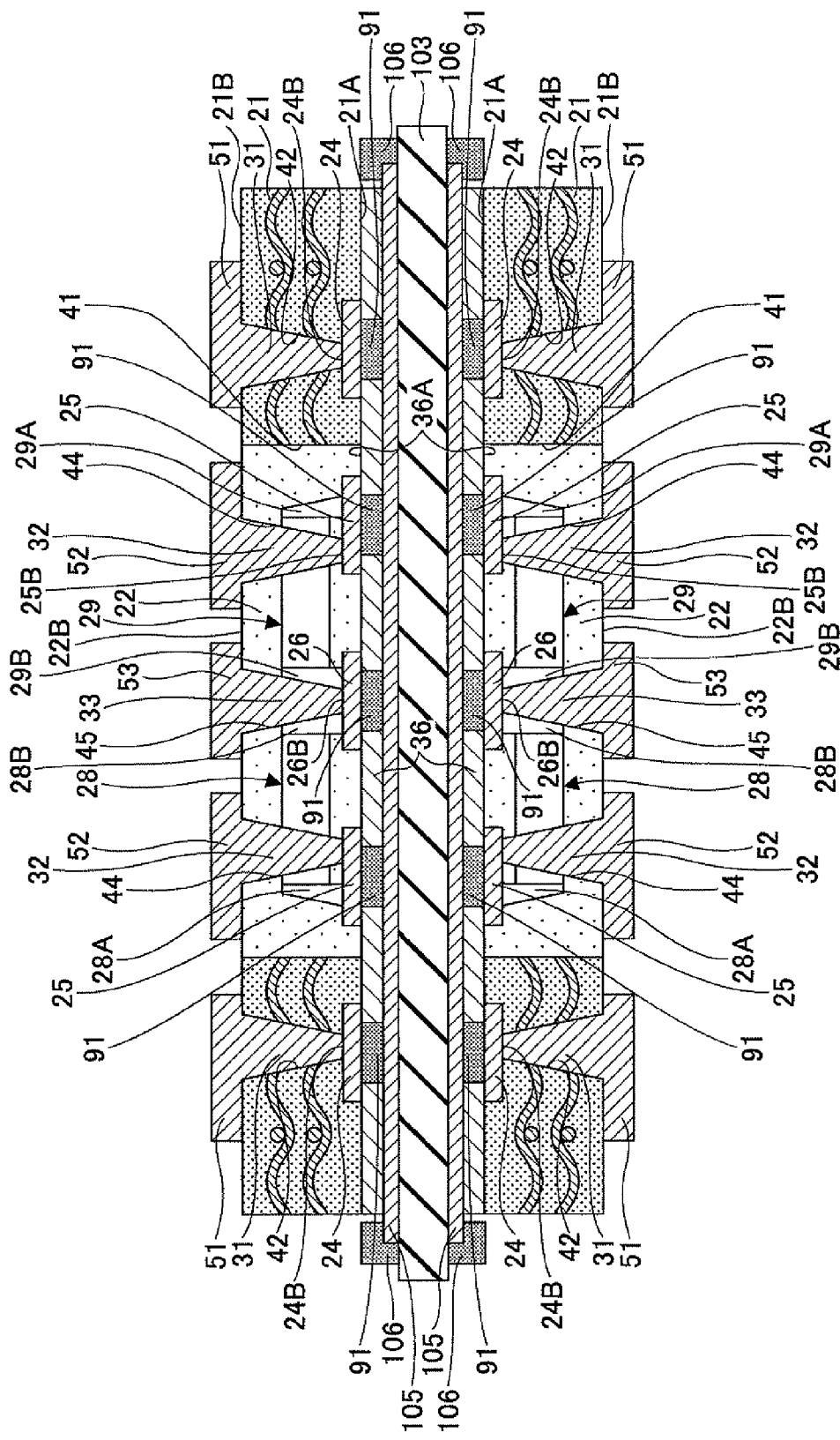
FIG. 12 is a diagram showing a fabricating process of the semiconductor device in the embodiment of the present invention.

Next, in the process shown in FIG. 12, the via 31 which fills the penetration hole 42, the wiring 51 that is formed integrally with the via 31, the via 32 which fills the penetration hole 44, the wiring 52 that is formed integrally with the via 32, the via 33 which fills the penetration hole 45, and the wiring 53 that is formed integrally with the via 33 are formed simultaneously. More particularly, the vias 31, 32 and 33 and the wirings 51, 52 and 53 are formed using the semi-additive technique, for example. For example, the vias 31, 32 and 33 and the wirings 51, 52 and 53 may be made of Cu.

Figure 13:
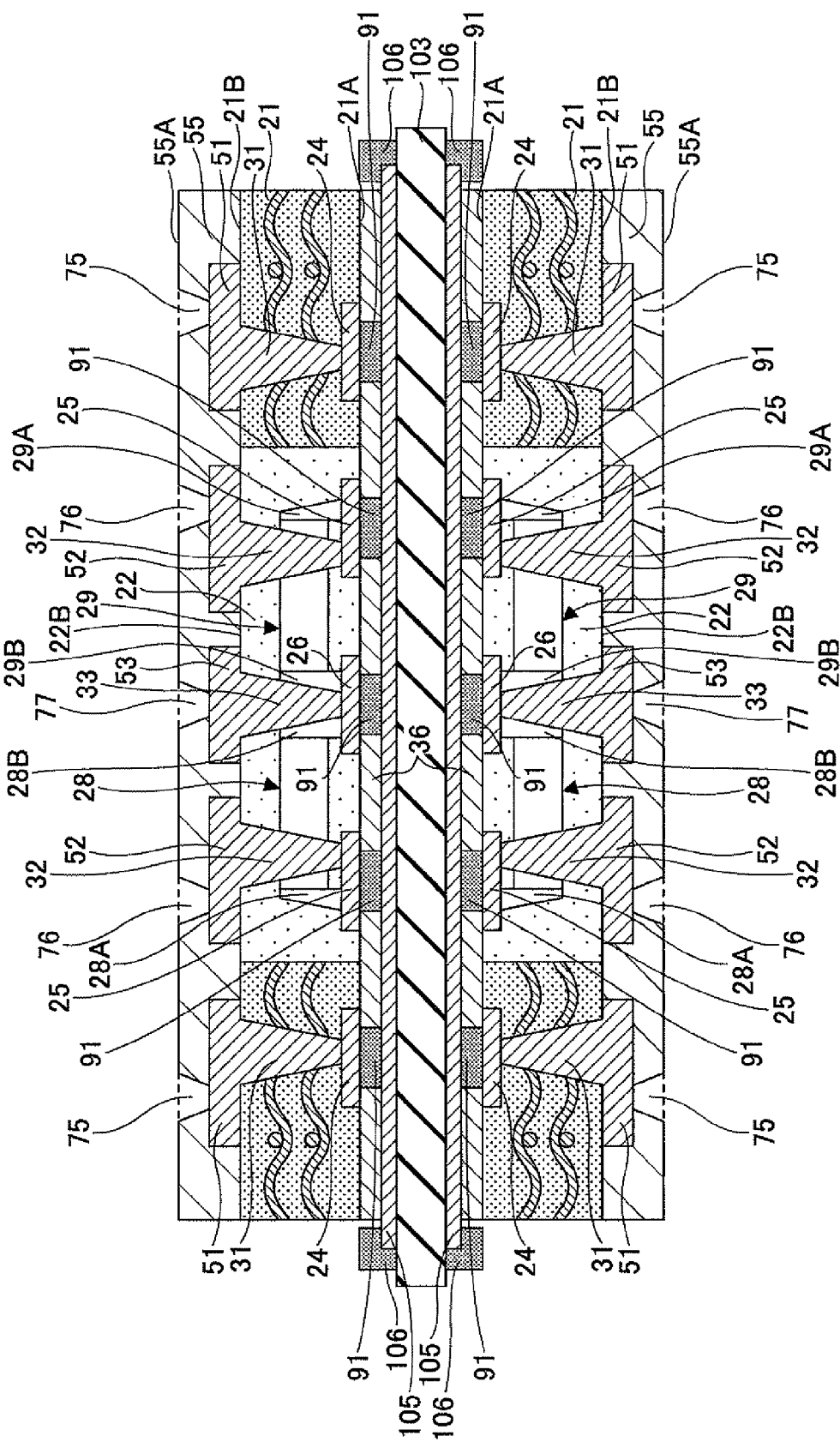
FIG. 13 is a diagram showing a fabricating process of the semiconductor device in the embodiment of the present invention.

Next, in the process shown in FIG. 13, the insulator layer 55, including the openings 75, 76 and 77, is formed on the surface 21B of the reinforcing member 21 and the surface 22B of the insulating member 22 that are provided on the structure shown in FIG. 12. For example, the insulator layer 55 may be made of a resin. When forming the insulator layer 55 by a resin layer, this resin layer may be made of epoxy resins, polyimide resins and the like. For example, the openings 75, 76 and 77 may be formed in the insulator layer 55 by laser processing. The opening 75 is formed so as to expose a portion of the wiring 51, and the opening 76 is formed so as to expose a portion of the wiring 52. The opening 77 is formed so as to expose a portion of the wiring 53.

Figure 14:
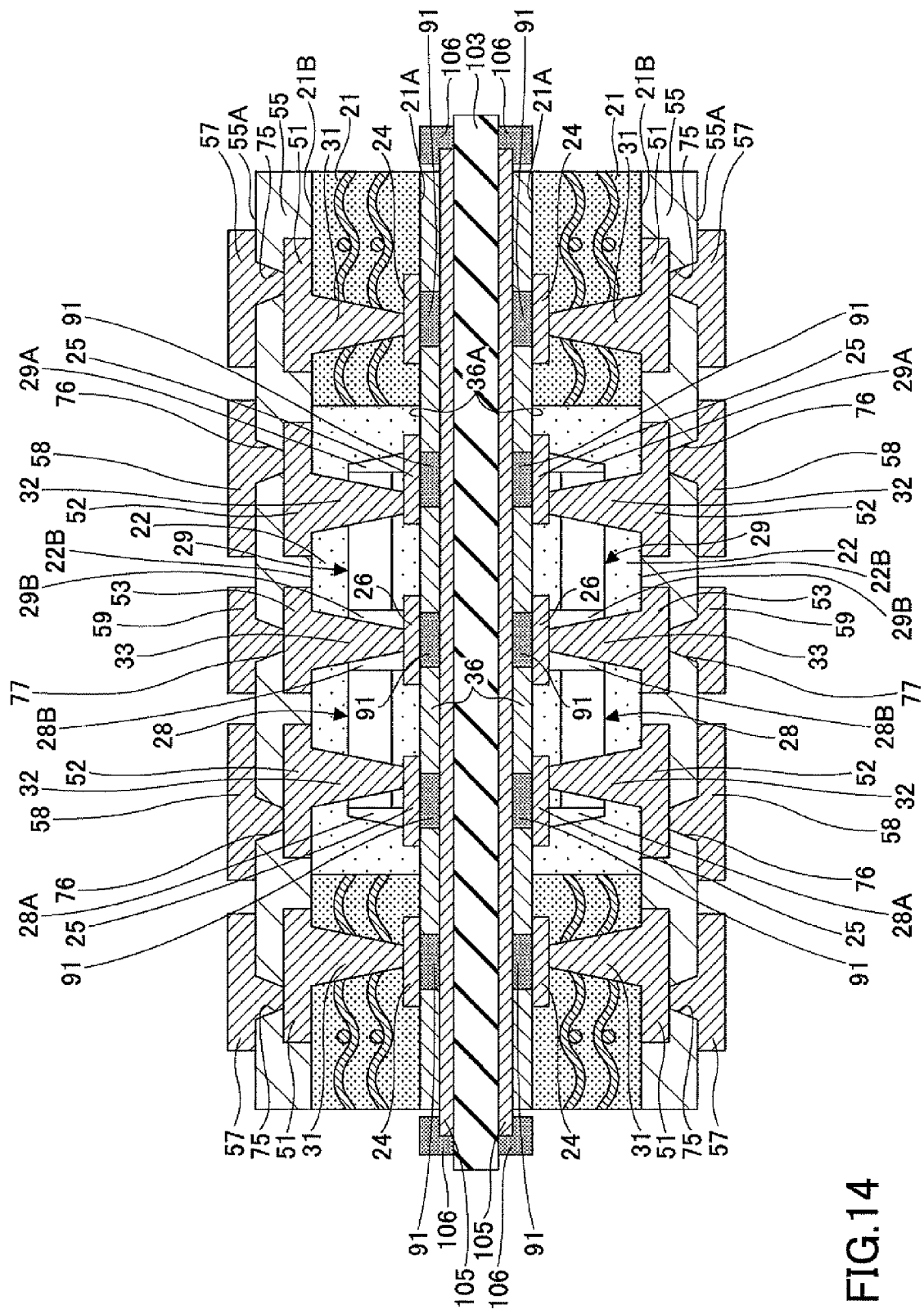
FIG. 14 is a diagram showing a fabricating process of the semiconductor device in the embodiment of the present invention.

Next, in the process shown in FIG. 14, the wiring pattern 57 is formed in (to fill) the opening 75 and on the surface 55A of the insulator layer 55, the wiring pattern 58 is formed in (to fill) the opening 76 and on the surface 55A of the insulator layer 55, and the wiring pattern 59 is formed in (to fill) the opening 77 and on the surface 55A of the insulator layer 55, simultaneously. More particularly, the wiring patterns 57, 58 and 59 may be formed using the semi-additive technique, for example. For example, the wiring patterns 57, 58 and 59 may be made of Cu.

Figure 15:
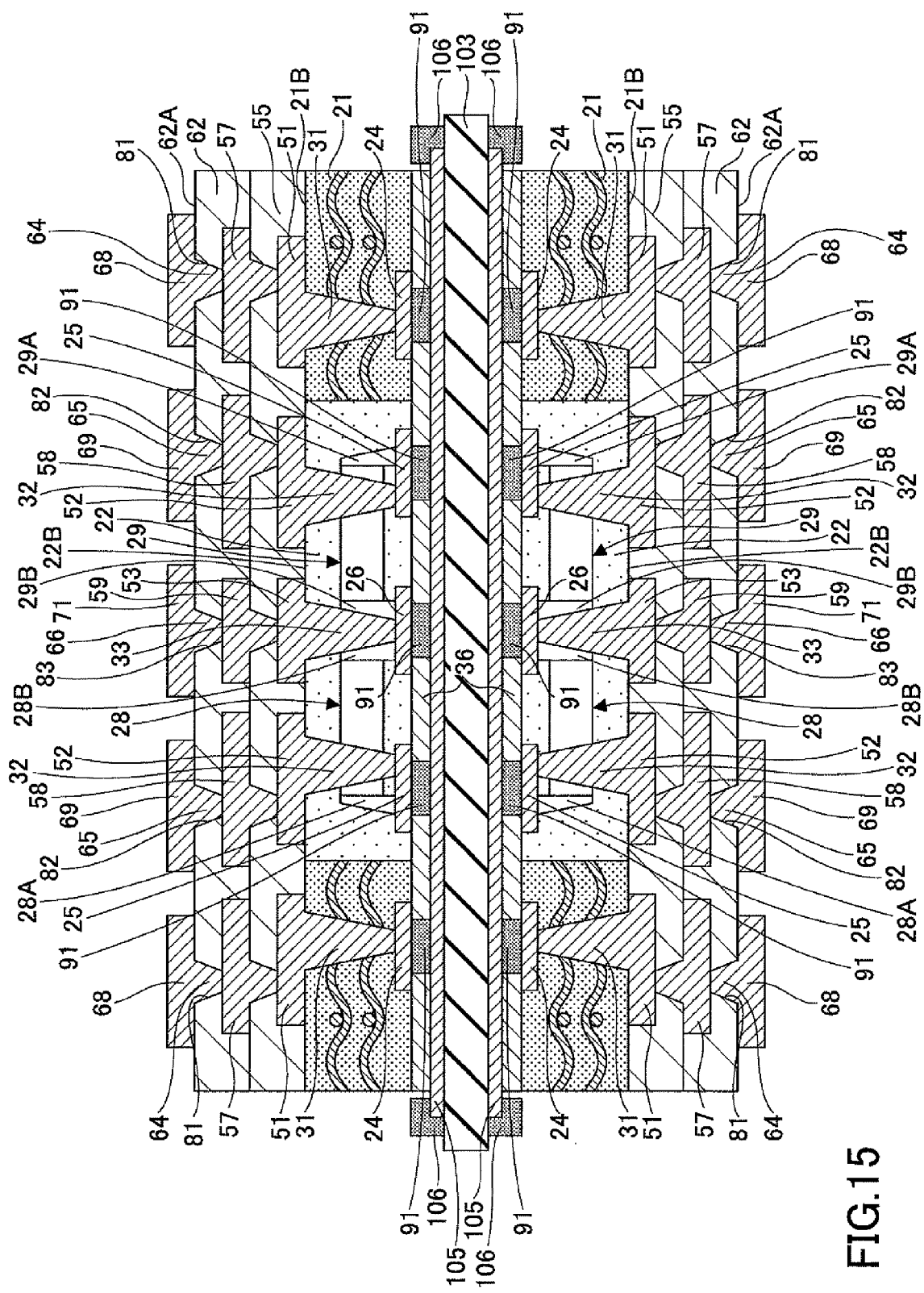
FIG. 15 is a diagram showing a fabricating process of the semiconductor device in the embodiment of the present invention.
Figure 16:
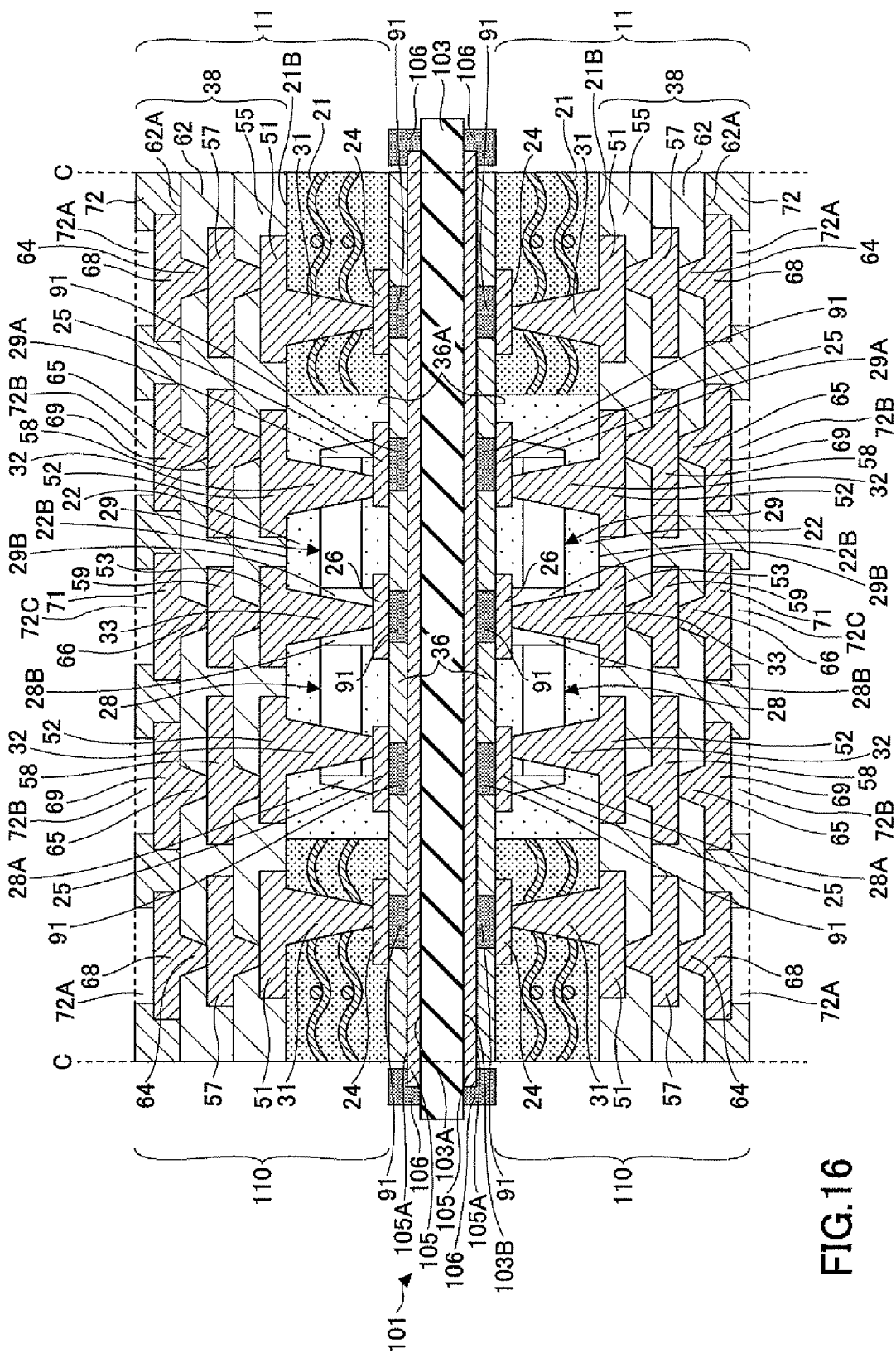
FIG. 16 is a diagram showing a fabricating process of the semiconductor device in the embodiment of the present invention.

Next, in the process shown in FIG. 15, a process similar to that shown in FIG. 13 is performed. In other words, the insulator layer 62, including the openings 81, 82 and 83, is formed on the surface 55A of the insulator layer 55 that is provided on the structure shown in FIG. 14, and thereafter, a process similar to that shown in FIG. 14 is performed in order to form the vias 64, 65 and 66 and the connection pads 68, 69 and 71 on the insulator layer 62.

For example, the insulator layer 62 is made of a resin. When a resin layer is used for the insulator layer 62, this resin layer may be made of epoxy resins, polyimide resins and the like. For example, the vias 64, 65 and 66 may be made of Cu. For example, the connection pads 68, 69 and 71 may be formed by a stacked structure which is formed on the surface 62A of the insulator layer 62 by successively stacking a Cu layer, a Ni layer and a Au layer.

Next, in the process shown in FIG. 16, the solder resist layer 72, including the openings 72A, 72B and 72C, is formed on the surface 62 of the insulator layer 62 that is provided on the structure shown in FIG. 15. In this state, the opening 72A is formed to expose a portion of the connection pad 68, and the opening 72B is formed to expose a portion of the connection pad 69. In addition, the opening 72C is formed to expose a portion of the connection pad 71. Hence, a structure 110 having the metal film 105 and the printed circuit board 11, successively formed on each of the surfaces 103A and 103B of the main support body 103, is formed. The printed circuit board 11 includes the multi-layer wiring structure 38 that is provided on the metal film 105. The processes shown in FIGS. 12 through 16 form to a multi-layer wiring structure forming process.

Figure 17:
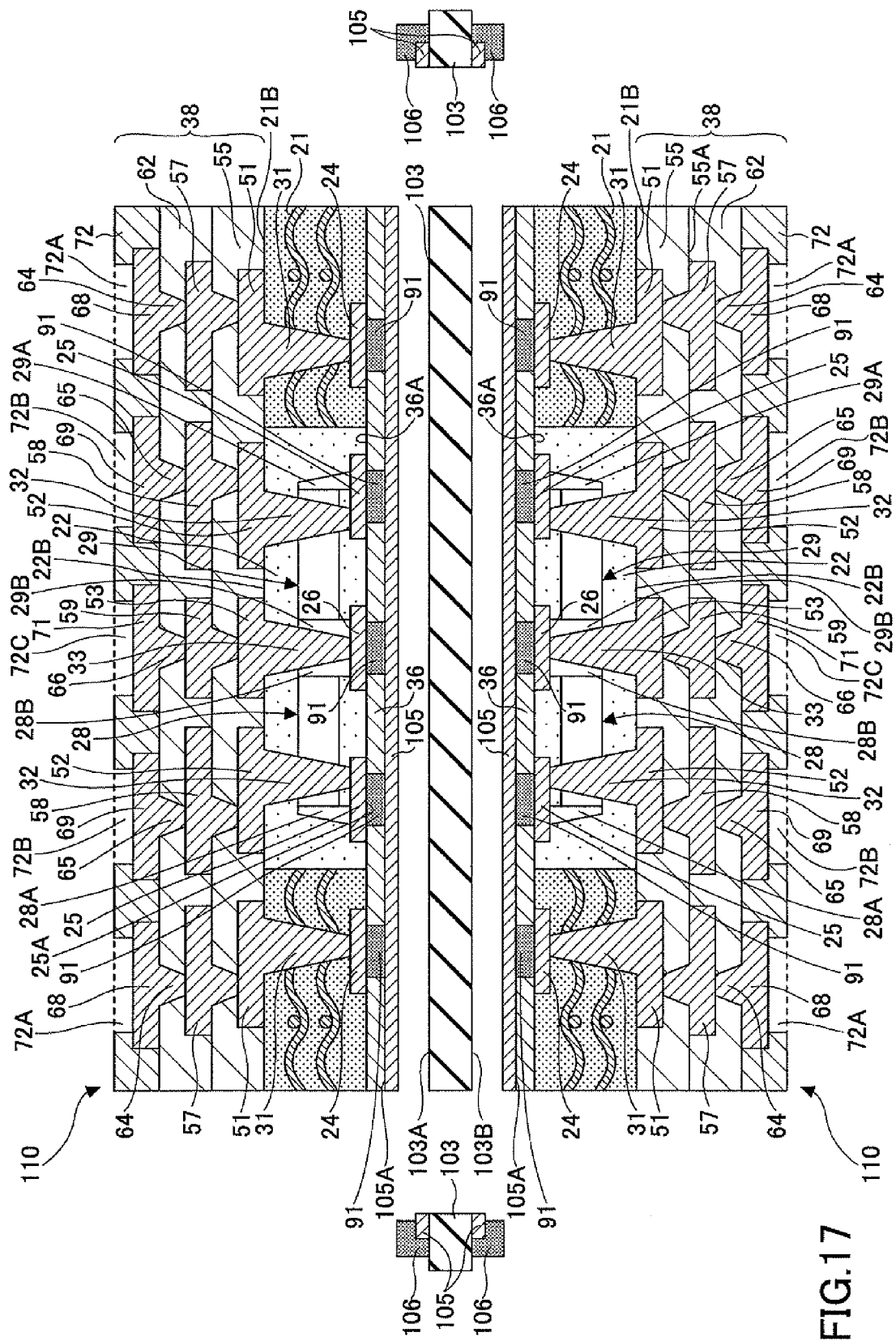
FIG. 17 is a diagram showing a fabricating process of the semiconductor device in the embodiment of the present invention.

Next, in the process shown in FIG. 17, the main support body 103 and the two metal films 105 are cut along the cutting position B shown in FIG. 16, in order to form two separate structures 110.

Figure 18:
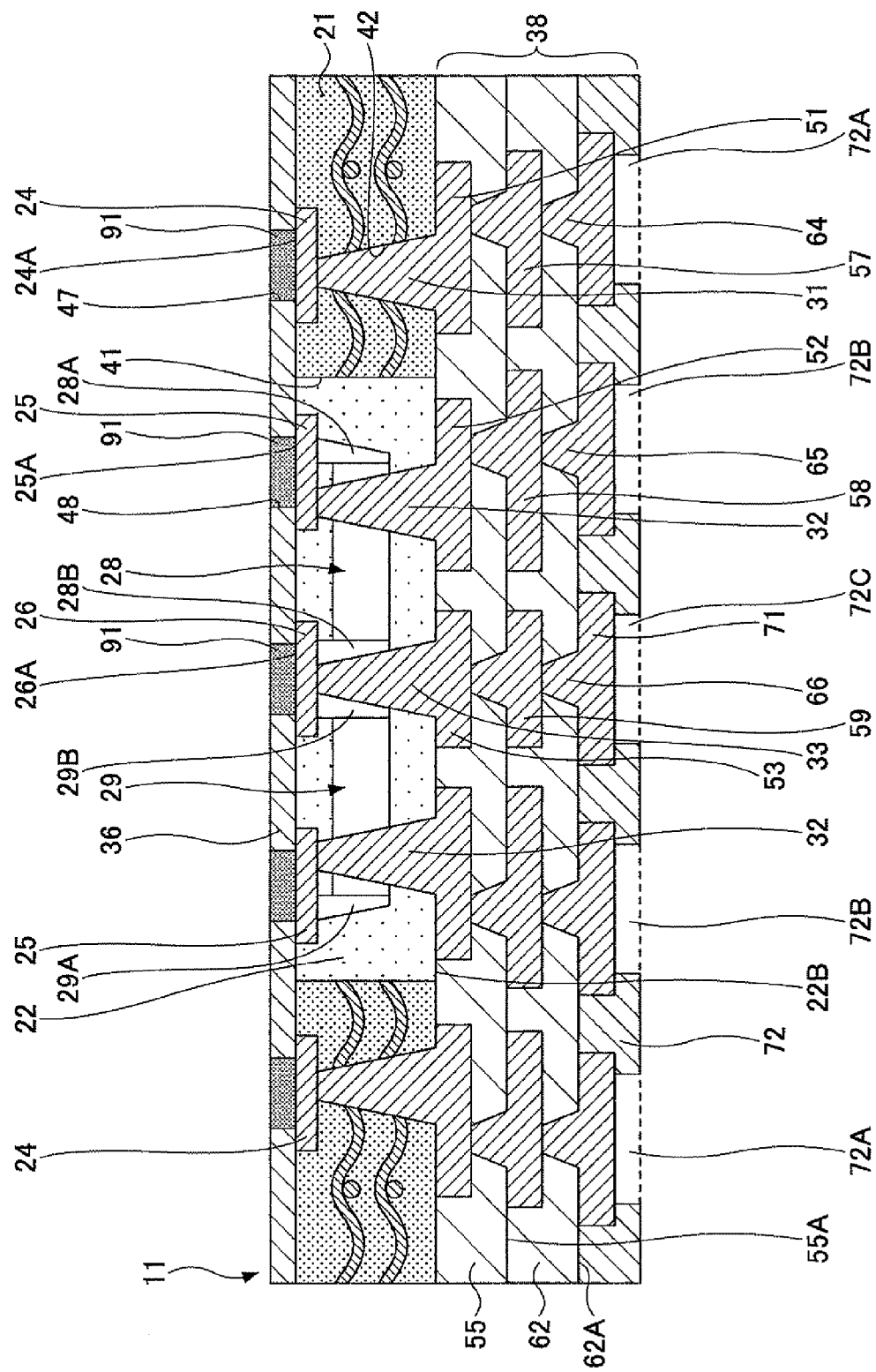
FIG. 18 is a diagram showing a fabricating process of the semiconductor device in the embodiment of the present invention.

Next, in the process shown in FIG. 18, the structure 110 shown in the upper half of FIG. 17 is turned upside-down, so that the capacitor 28 of this structure 110 is arranged on the right side of the capacitor 29, and the metal film 105 is thereafter removed from the structure 110 in this upside-down orientation. For example, the metal film 105 may be removed from the structure 110 by a wet etching. As a result, the printed circuit board 11 is fabricated. The processes shown in FIGS. 17 and 18 form a support body removing process.

Figure 19:
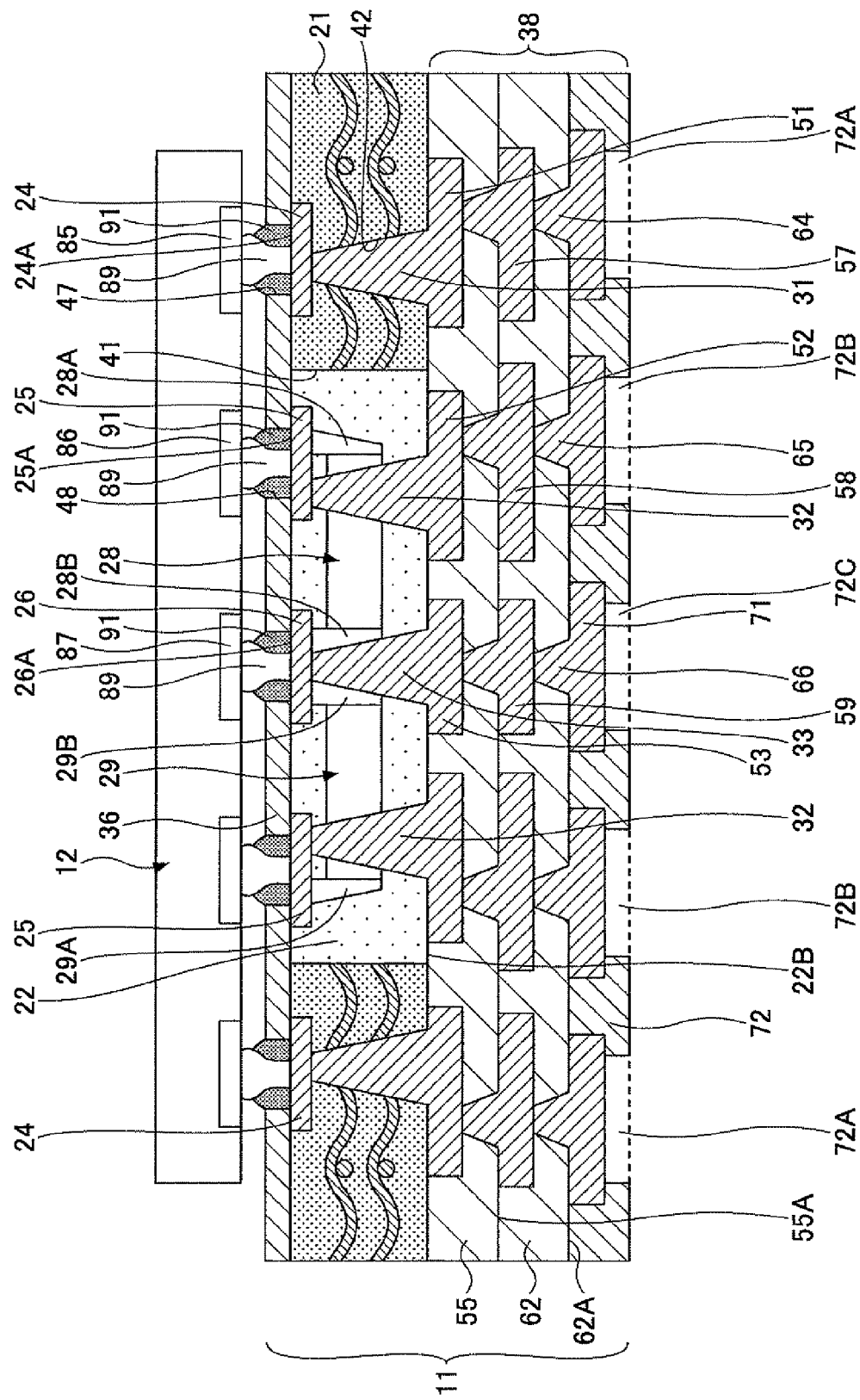
FIG. 19 is a diagram showing a fabricating process of the semiconductor device in the embodiment of the present invention.

Next, in the process shown in FIG. 19, the semiconductor chip 12 having the bumps 89 formed on the electrode pads 85, 86 and 87 is prepared, and the bumps 89 are pressed against the solder 91. In addition, the solder 91 is melted, in order to perform flip-chip bonding of the semiconductor chip 12 on the signal pads 24, the ground wiring patterns 25 and the power supply wiring patterns 26.

Figure 20:
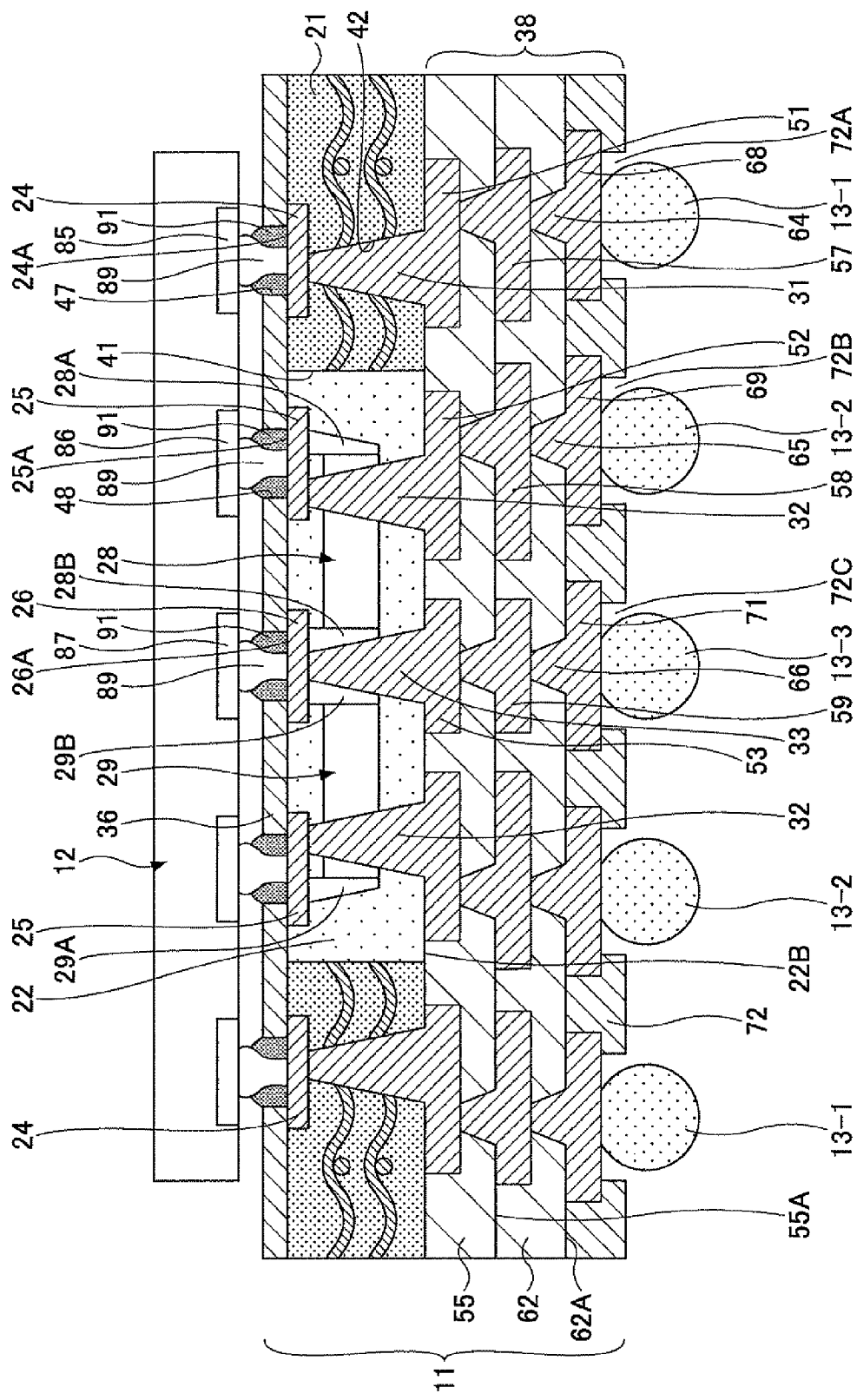
FIG. 20 is a diagram showing a fabricating process of the semiconductor device in the embodiment of the present invention.

Next, in the process shown in FIG. 20, the external connection terminals 13-1 are formed on the connection pads 68, the external connection terminals 13-2 are formed on the connection pads 69, and the external connection terminals 13-3 are formed on the connection pads 71. As a result, the semiconductor device 10 of this embodiment is fabricated. For example, solder balls may be used for the external connection terminals 13-1, 13-2 and 13-3.

According to the method of fabricating the printed circuit board 11 in this embodiment, by forming the solder resist layer 36 including the openings 47, 48 and 49 on the support body 101, then filling the openings 47, 48 and 49 by the solder 91, then forming the m+1 grounding wiring patterns 25 and the m power supply wiring patterns 26 on the surface 36A of the solder resist layer 36 and the surface 91A of the solder 91 so that the grounding wiring pattern 25 and the power supply wiring pattern 26 are alternately arranged in the direction A, and then connecting the plurality of capacitors 28 and 29 in parallel with respect to the m+1 grounding wiring patterns 25 and the power supply wiring patterns 26, it becomes possible to reduce the inductance components of the plurality of capacitors 28 and 29, when compared to the inductance component of the single capacitor 213 provided in the printed circuit board 201 of the conventional semiconductor device 200 shown in FIG. 1.

In addition, by setting the capacitances of the plurality of capacitors 28 and 29 to mutually different values in order to cope with the semiconductor chip 12 having various high-frequency characteristics when connecting the plurality of capacitors 28 and 29 in parallel with respect to the m+1 grounding wiring patterns 25 and the power supply wiring patterns 26 in the capacitor connecting process, it becomes possible to reduce the power supply noise caused by the changes in the current consumption of the semiconductor chip 12 by the plurality of capacitors 28 and 29.

Furthermore, by providing the reinforcing member 21, which is formed by the glass epoxy substrate that is made up of a glass fiber covered by a resin, for example, it is possible to reduce warping of the multi-layer wiring structure 38.

In the embodiment described above, the external connection terminals 13-1, 13-2 and 13-3 are formed after bonding the semiconductor chip 12 on the printed circuit board 11 by flip-chip bonding. However, it is of course possible to provide a process of forming the external connection terminals 13-1, 13-2 and 13-3 between the process of forming the solder resist layer 72 and the process of cutting the main support body 103 and the two metal films 105.

Moreover, in the embodiment described above, the solder resist layer 36 having the openings 47, 48 and 49 is formed on the Cu film, then the pads and the wiring patterns are formed, and thereafter the insulator (resin) layer is stacked. However, it is of course possible instead to form a resist on the Cu film, then, form the openings corresponding to the openings 47, 48 and 49 in the resist, then form the vias and/or the wirings, and thereafter form the solder resist layer on the insulator (resin) layer so as to expose a portion of the pad or wiring pattern.

Therefore, the present invention is applicable to various printed circuit boards having capacitors to be electrically connected to a semiconductor chip, methods of fabricating such printed circuit boards, and semiconductor devices having such printed circuit boards.

This application claims the benefit of Japanese Patent Applications No. 2008-135610 filed on May 23, 2008 and No. 2009-121425 filed on May 19, 2009, in the Japanese Patent Office, the disclosures of which are hereby incorporated by reference.

Further, the present invention is not limited to these embodiments, but various variations and modifications may be made without departing from the scope of the present invention.

What is claimed is:

1. A printed circuit board comprising:
a plurality of capacitors each having a first electrode and a second electrode;
a grounding wiring pattern having a first chip bonding surface configured to receive a semiconductor device to be bonded thereon, and a first contact surface that is located on an opposite end from the first chip bonding surface and is connected to the first electrode of the capacitors;
a power supply wiring pattern having a second chip bonding surface configured to receive the semiconductor device to be bonded thereon, and a second contact surface that is located on an opposite end from the second chip bonding surface and is connected to the second electrode of the capacitors;
a reinforcing member made of an insulator and provided on the solder resist layer and having a penetration part configured to accommodate the plurality of capacitors; and
an insulating member provided in the penetration part and configured to encapsulate the plurality of capacitors,
wherein the plurality of capacitors are coupled in parallel with respect to the grounding wiring pattern and the power supply wiring pattern, and
wherein the plurality of capacitors include capacitors having mutually different capacitances.

2. The printed circuit board as claimed in claim 1, wherein a number of one of the grounding wiring pattern and the power supply wiring pattern that is provided is m+1, and a number of another of the grounding wiring pattern and the power supply wiring pattern that is provided is m, where m is an natural number greater than or equal to one.

3. The printed circuit board as claimed in claim 1, wherein the reinforcing member is formed by a glass epoxy substrate.

4. The printed circuit board as claimed in claim 1, wherein a first planar surface of the reinforcing member located on an end opposite to a second surface of the reinforcing member in contact with the solder resist layer approximately matches a first planar surface of the insulating member located on an end opposite to a second surface of the insulating member in contact with the solder resist layer, 5. The printed circuit board as claimed in claim 4, further comprising:
a multi-layer wiring structure, provided on the first planar surfaces of the reinforcing member and the insulating member, and electrically coupled to the plurality of capacitors.

6. The printed circuit board as claimed in claim 1, further comprising:
a solder resist layer having a plurality of openings configured to expose the first chip bonding surface, and a plurality of openings configured to expose the second chip bonding surface.

7. The printed circuit board as claimed in claim 1, wherein the grounding wiring pattern and the power supply wiring pattern are alternately arranged in a predetermined direction.

8. The printed circuit board as claimed in claim 7, wherein the grounding wiring pattern and the power supply wiring pattern are formed by a single, common conductor layer.

9. The printed circuit board as claimed in claim 1, wherein the grounding wiring pattern and the power supply wiring pattern are formed by a single, common conductor layer.

10. A semiconductor device comprising:
a semiconductor chip; and
a printed circuit board,
the printed circuit board comprising:
a plurality of capacitors each having a first electrode and a second electrode;
a grounding wiring pattern having a first chip bonding surface configured to receive the semiconductor device bonded thereon, and a first contact surface that is located on an opposite end from the first chip bonding surface and is connected to first electrode of the capacitors;
a power supply wiring pattern having a second chip bonding surface configured to receive the semiconductor device bonded thereon, and a second contact surface that is located on an opposite end from the second chip bonding surface and is connected to the second electrode of the capacitors;
a solder resist layer having a plurality of openings configured to expose the first chip bonding surface, and a plurality of openings configured to expose the second chip bonding surface;
a reinforcing member made of an insulator and provided on the solder resist layer and having a penetration part configured to accommodate the plurality of capacitors; and an insulating member provided in the penetration part and configured to encapsulate the plurality of capacitors, wherein the plurality of capacitors are coupled in parallel with respect to the grounding wiring pattern and the power supply wiring pattern, and wherein the plurality of capacitors include capacitors having mutually different capacitances.

11. The semiconductor device as claimed in claim 10, wherein the grounding wiring pattern and the power supply wiring pattern are alternately arranged in a predetermined direction.

12. The semiconductor device as claimed in claim 11, wherein the grounding wiring pattern and the power supply wiring pattern are formed by a single, common conductor layer.

13. The semiconductor device as claimed in claim 10, wherein the grounding wiring pattern and the power supply wiring pattern are formed by a single, common conductor layer.

* * * * *